(12) United States Patent
Iida et al.

(10) Patent No.: US 6,573,504 B2
(45) Date of Patent: Jun. 3, 2003

(54) INFRARED SENSOR AND MANUFACTURING METHOD THEREOF

(75) Inventors: Yoshinori Iida, Kita-Ku (JP); Keitaro Shigenaka, Hachioji (JP); Naoya Mashio, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/819,596

(22) Filed: Mar. 29, 2001

(65) Prior Publication Data

US 2001/0028035 A1 Oct. 11, 2001

(30) Foreign Application Priority Data

Mar. 30, 2000 (JP) ......................................... 2000-095687

(51) Int. Cl.[7] .................................................. G01J 5/20

(52) U.S. Cl. ...................... 250/338.4; 250/332; 250/330
(58) Field of Search ................................. 250/330, 332, 250/338.3, 338.4, 339.02

(56) References Cited

U.S. PATENT DOCUMENTS 5,369,280 A * 11/1994 Liddiard ................. 250/370.08
5,640,013 A * 6/1997 Ishikawa et al. ......... 250/338.4
6,163,061 A    12/2000 Iida

FOREIGN PATENT DOCUMENTS

JP          10-185681         7/1998

OTHER PUBLICATIONS

T. Ishikawa, et al., Part of the SPIE Conference on Infrared Technology and Applications XXV, vol. 3698, pp. 556–564, "Low–Cost 320 × 240 Uncooled IRFPA Using Conventional Silicon Process", Apr. 1999.

Patent Abstracts of Japan, JP 09–280957, Oct. 31, 1997.

Toshio Kanno, Minoru Saga, "Uncooled infrared focal plane array having 128×128 thermopile detector elements", SPIE vol. 2269 Infrared Technology XX (1994), pp. 450–459.

R. A. Wood, "High–Performance Infrared Thermal Imaging with Monolithic Silicon Focal Planes Operating at Room Temperature", 1993 IEEE, IEDM 93–175, pp. 8.1.1–8.1.3.

Charles Hanson, "Uncooled Thermal Imaging at Texas Instruments", SPIE vol. 2020 Infrared Technology X1X (1993), 0–8194–1269–4/93, pp. 330–339.

* cited by examiner

*Primary Examiner*—Constantine Hannaher
*Assistant Examiner*—Timothy Moran
(74) *Attorney, Agent, or Firm*—Oblon, Spivak, McClelland, Maier & Neustadt, P.C.

(57) ABSTRACT

An object of the present invention is to provide a high-sensitivity infrared sensor. According to the present invention, a support member for supporting a sensor portion in a cavity structure is formed to be remarkably thin as compared with a conventional structure, a sectional area of the support member is considerably reduced, heat conductance can remarkably be reduced and, as a result, the infrared sensor having a remarkably high sensitivity can be obtained. Moreover, according to the present invention, since an insulating layer of a support member area is etched, and a sacrifice silicon film is embedded in the area, an aspect ratio of an insulating layer RIE for forming a support leg is remarkably reduced. A manufacturing process is facilitated, a sectional area of the support leg is further reduced as a secondary effect, and the sensitivity of the infrared sensor can further be enhanced.

20 Claims, 21 Drawing Sheets

INFRARED SENSOR AND MANUFACTURING METHOD THEREOF

CROSS REFERENCE TO RELATED APPLICATIONS

This application claims the priority right under 35 U.S.C. 119 of Japanese Patent Application No. 95687/2000 filed on Mar. 30, 2000, the entire disclosure of which is incorporated by reference.

BACKGROUND OF THE INVENTION

1. Field of the Invention

The present invention relates to an infrared sensor and a manufacturing method of the infrared sensor, and more particularly, it relates to a pixel structure of a uncooled infrared sensor and a manufacturing method of the structure, and provides a high-sensitivity uncooled infrared sensor and a manufacturing method of the infrared sensor.

2. Related Background Art

Infrared image pickup has characteristics that the image pickup enables day and night, and that an infrared ray is higher in transmittance to smoke or fog than a visible ray. Furthermore, temperature information of a subject can also be obtained. Therefore, the infrared image pickup has a broad application range in a security field and as a monitor camera and a fire detection camera.

As a largest defect of a quantum type infrared solid image pickup apparatus which has been a conventional main type, a cooling mechanism is necessary for a low-temperature operation. In recent years, however, "uncooled infrared solid image pickup element" requiring no cooling mechanism has well been developed. The infrared solid image pickup apparatus of the uncooled, i.e., a thermal type converts an incident infrared ray with a wavelength of about $10\mu$ to heat by an absorption structure, and then converts a temperature change of a heat sensitive portion caused by the slight heat to an electric signal by some thermoelectric conversion means, and then reads out this electric signal to obtain infrared image information.

In order to enhance sensitivity of such uncooled infrared sensor, there are three largely classified methods.

In a first method, a ratio of a power change dP of an infrared ray incident upon an infrared detector for temperature change dTs of a subject, that is, dP/dTs is enhanced. In this method, the sensitivity is enhanced mainly by an optical system. This method includes enlargement of an aperture diameter of an infrared lens, use of an reflection (AR) coating, use of a low-absorption lens material, enhancement of infrared absorbency of the infrared detector, enlargement of an infrared absorption area, and the like.

In recent years, the uncooled infrared sensor has tended to have multiple pixels. Moreover, a unit pixel size is mainly about $40 \mu m \times 40 \mu m$. In the aforementioned problems, the enlargement of the infrared absorption area in the infrared detector remains to be relatively important.

However, it has been reported that the infrared absorption area is enhanced to about 90% of a pixel area by laminating/forming infrared absorption layers on an upper portion of the pixel (Tomohiro Ishikawa, et al., Proc. SPIE Vol. 3698, p.556, 1999). It is difficult to further enhance the sensitivity by optical means.

In a second method, a ratio of the incident infrared power change dP to an infrared detector temperature change dTd, i.e., dTd/dP is enhanced. While the first method is an optical technique, the second method is a thermal method. Generally, in the uncooled infrared sensor mounted on a vacuum package, for transport of heat to a support substrate from the infrared detector, thermal conduction of a support structure for supporting the infrared detector in a cavity structure inside the support substrate is dominant now. Therefore, a leg-like support structure formed of a material with a low thermal conductivity is designed to be thinner and longer in a layout within a possible range (e.g., Tomohiro Ishikawa, et al., Proc. SPIE Vol. 3698, p.556, 1999).

However, the pixel size is reduced to about $40 \mu m \times 40 \mu m$, and a fine processing is performed at a silicon LSI process level. Therefore, it is difficult to further enhance the sensitivity by devising the layout of the support structure. Similarly, it is also difficult to further reduce the thermal conductivity as one of material characteristics of the support structure. Particularly, for a wiring for outputting the electric signal from the infrared detector, there are contrary requests for electric conduction and heat conduction which are similar to each other in mechanism, and it is also difficult to realize a remarkable sensitivity enhancement in respect of the material.

In a third method, a ratio of an electric signal change dS caused by the thermoelectric conversion means to temperature change dTd of the infrared, i.e., dS/dTd is enhanced, and this is an electric method. Different from the other two methods, in the third method, simple sensitivity enhancement, i.e., enhancement of dS/dTd is an object, but it is very important to reduce various electric noises which are simultaneously generated. Various thermoelectric conversion means have been studied.

Main means are as follows.
(1) Thermopile for converting a temperature difference to a potential difference by Seebeck effect
(e.g., Toshio Kanno, et al., Proc. SPIE Vol. 2269, pp. 450 to 459, 1994)
(2) Bolometer for converting a temperature change to a resistance change in accordance with a change temperature of a resistor
(e.g., A. Wood, Proc. IEDM, pp. 175 to 177, 1993)
(3) Pyroelectric element for converting the temperature change to a charge by a pyroelectric effect
(e.g., Charles Hanson, et al., Proc. SPIE Vol. 2020, pp. 330 to 339, 1993)
(4) Silicon pn junction for converting the temperature change to a voltage change in accordance with a constant forward-bias current
(e.g., Tomohiro Ishikawa, et al., Proc. SPIE Vol. 3698, p.556, 1999, hereinafter "Ishikawa et al")

However, when comparing respective systems with one another, and considering all of thermoelectric conversion characteristics, noise characteristics, and manufacturing methods, it cannot be said under existing circumstances that there is a system decisively superior to the other systems. For example, the bolometer is superior in respect of temperature resolution, but the silicon pn junction is superior in respect of manufacturing processes because this junction can be manufactured only with a conventional silicon LSI process.

As described above, as one method for enhancing the sensitivity of the uncooled infrared sensor, there is the thermal method, in which the ratio of the infrared detector temperature change dTd to the incident infrared power change dP, i.e., dTd/dP is enhanced.

Generally, for the heat transport to the support substrate from the infrared detector, the heat conduction of the support structure for supporting the infrared detector in the cavity structure inside the support substrate is dominant. The leg-like support structure of the material having the low thermal conductivity is designed to be thinner and longer in the layout within the possible range. However, the pixel size is reduced to about 40 μm×40 μm. In such minute size, the fine processing is already performed at the silicon LSI process level. Therefore, it is difficult to realize remarkable sensitivity enhancement by devising the layout of the support structure.

SUMMARY OF THE INVENTION

The present invention has been developed based on recognition of the problems, and an object thereof is to provide an infrared sensor and a manufacturing method of the infrared sensor in which a sectional area of a support structure for supporting an infrared detector is remarkably reduced as compared with a conventional sectional area, and detection sensitivity is considerably improved by inhibiting heat "escape".

To achieve the aforementioned object, there is provided an infrared sensor comprising:

a semiconductor substrate having a plurality of concave portions;

a plurality of infrared detectors formed above said semiconductor substrate, each of said infrared detectors having an absorber for absorbing an incident infrared ray to convert the incident infrared ray to heat, and a thermoelectric converter for converting a temperature change caused by the heat generated in said absorber to an electric signal, said thermoelectric converter including a semiconductor layer formed under said absorber, said pn junction being formed in said semiconductor layer to convert the temperature change to the electric signal; and one or more support members for supporting each of said plurality of infrared detectors in corresponding one of said concave portions and apart from said semiconductor substrate, said support members extending in a direction substantially parallel to a surface of said semiconductor layer.

one end of each of said support members is connected to corresponding one of said infrared detectors and the other end thereof is connected to said semiconductor substrate, and a thickness of each of said support members is smaller than that of corresponding one of said infrared detectors.

According to the present invention, in the aforementioned constitution, the support member disposed between the infrared detector and the semiconductor substrate can be formed to be considerably thin. Even when a layout limited by a fine processing level is the same, a sectional area of the support member can remarkably be reduced. Therefore, heat conduction of the support member, which controls heat transport between the infrared detector and the support member, can remarkably be reduced. As a result, a high-sensitivity uncooled infrared sensor can be obtained.

DESCRIPTION OF THE PREFERRED EMBODIMENTS

Concrete examples of embodiments of the present invention will be described hereinafter in detail with reference to the accompanying drawings.

(First Embodiment)

Figure 1:
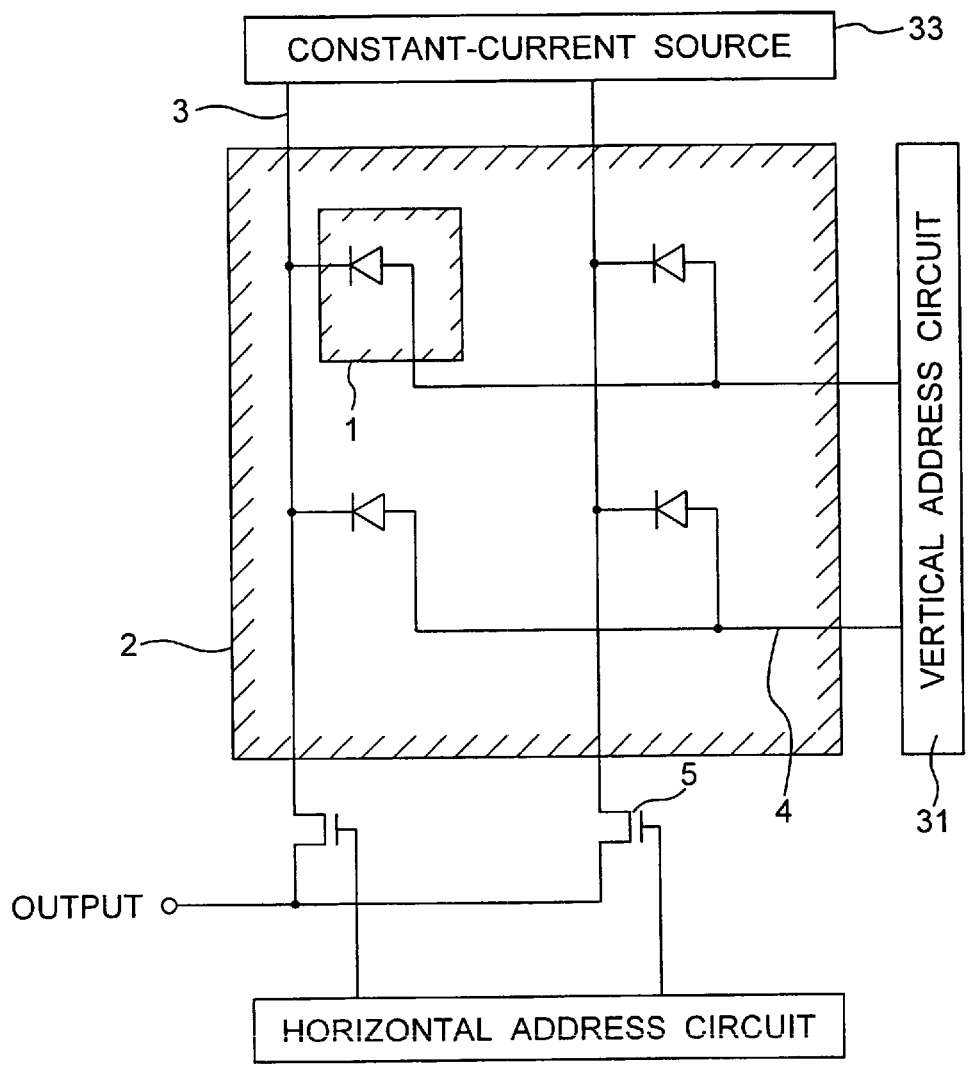
FIG. 1 is a whole constitution diagram of an infrared sensor according to a first embodiment of the present invention.

FIG. 1 is a whole constitution diagram of an infrared sensor according to a first embodiment of the present invention.

An infrared detection pixel 1 for converting an incident infrared ray to an electric signal is two-dimensionally disposed on a semiconductor substrate, a vertical address circuit 31 and horizontal address circuit 32 for selecting the pixel are arranged adjacent to an infrared detection pixel array 2, and the signal is successively outputted from the selected pixel.

The infrared detection pixel 1 of FIG. 1 is a forward biased pn junction, and a constant-current source 33 for forward-biasing the pn junction of the pixel is also disposed adjacent to the infrared detection pixel array 2. Here, in FIG. 1, four pixels of two lines×two rows are shown as the infrared detection pixel array 2 in FIG. 1.

A forward bias current supplied from the constant-current source 33 flows through current paths of a vertical signal line 3, selected pixel, and horizontal address line 4 in an infrared detection pixel line selected by the vertical address circuit 31, and a signal voltage generated in the vertical signal line 3 is successively selected and outputted by the horizontal address circuit 32.

In FIG. 1, a structure is shown as a simplest example in which the signal voltage generated in the vertical signal line 3 is directly outputted via a row selection transistor 5 successively selected by the horizontal address circuit 32. However, since this signal voltage is tiny, a structure for amplifying the signal voltage by a row unit may be disposed if necessary.

Figure 2:
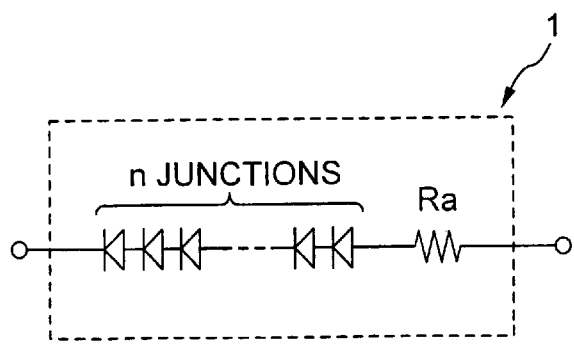
FIG. 2 is an equivalent circuit diagram of an infrared detection pixel 1 of FIG. 1.

FIG. 2 is an equivalent circuit diagram of the infrared detection pixel 1 of FIG. 1. For an enhanced sensitivity, n pieces of pn-junctions are connected in series, and an additional resistor Ra is connected in series with the pn junction.

The additional resistor Ra is constituted of a resistor R1 of a pixel internal wiring between the pn junction and the horizontal address line 4, and between the pn junction and the vertical signal line 3, a contact resistor Rc between this wiring and the pn junction, and a resistor Rs of p and n areas of the pn junction.

Figure 3A:
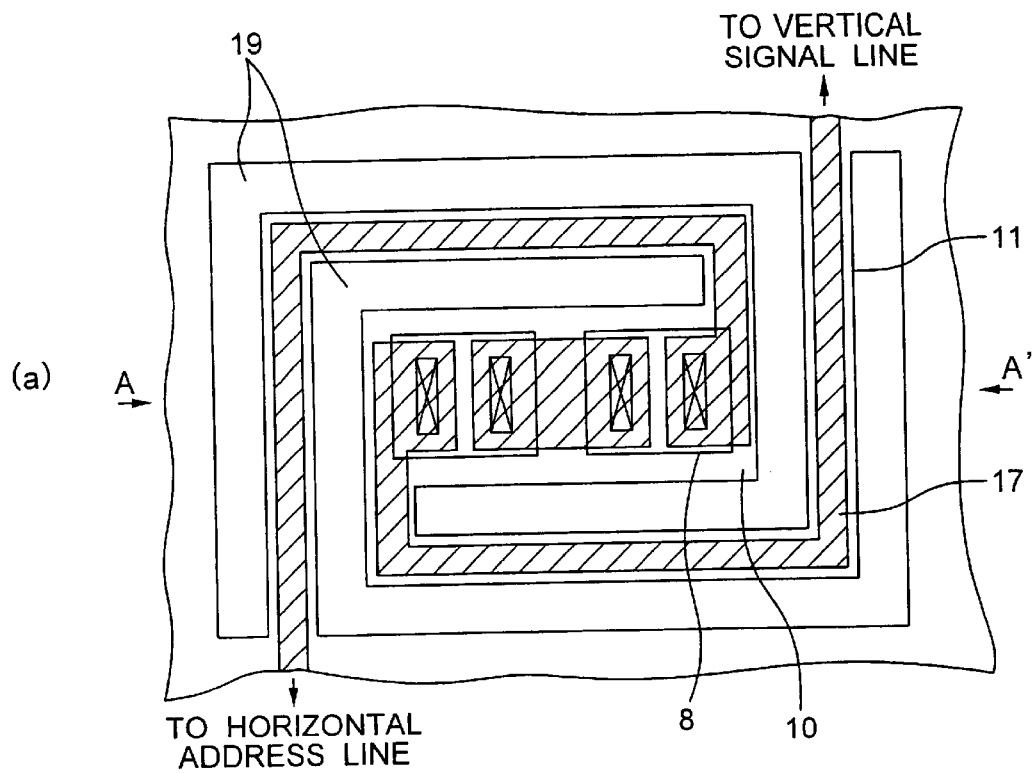
FIG. 3A is a plan view of the infrared detection pixel shown in FIG. 2.
Figure 3B:
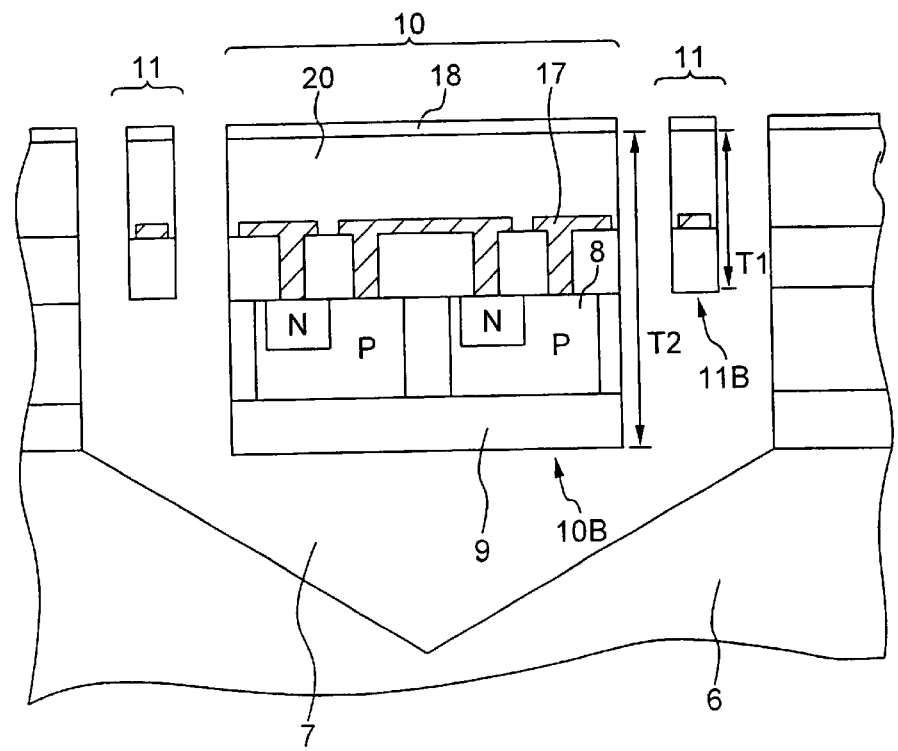
FIG. 3B is a sectional view taken along line A–A' of FIG. 3A.

FIG. 3A is a plan view of the infrared detection pixel shown in FIG. 2, and FIG. 3B is a sectional view taken along line A–A' of FIG. 3A. On a cavity structure 7 formed inside a single crystal silicon substrate 6, the infrared detection pixel 1 is constituted of a sensor portion 10 including an infrared absorption layer 18, pn junction inside an SOI layer 8 formed for thermoelectric conversion, and an embedded silicon oxide film layer 9 for supporting the SOI layer 8, a support portion 11 for supporting the sensor portion 10 on the cavity structure 7 and outputting the electric signal from the sensor portion 10, and a connection portion (not shown) for connecting the sensor portion 10 to the vertical signal line 3 and horizontal address line 4.

According to FIG. 3B, it seems as if the sensor portion 10 and support portion 11. floated in space, but actually, as shown in FIG. 3A, the sensor portion 10 is supported by one end of the support portion 11. The other end of the support portion 11 is connected to the vertical signal line and horizontal address line.

Since the sensor portion 10 and support portion 11 are disposed on the cavity structure 7, modulation of temperature of the sensor portion 10 by the incident infrared ray is efficiently performed. FIGS. 3A to 3B show a structure in which n=2.

Moreover, in the present invention, a thickness T1 of the support portion 11 is formed to be smaller than a thickness T2 of the sensor portion 10. Particularly, in the present example, a lower surface 11B of the support portion 11 is formed at a position higher than a position of a lower surface 10B of the sensor portion 10, so that the thickness T1 is smaller than T2. In this manner, since the thickness T1 of the support portion is small, heat "escape" is inhibited, and sensitivity to the infrared ray can largely be enhanced.

Manufacturing steps of the infrared detection pixel shown in FIGS. 3A to 3B will next be described.

Figure 4A:
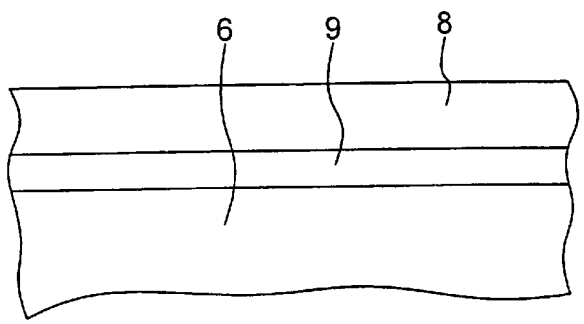
FIGS. 4A to 4D are main part sectional views showing manufacturing steps of the infrared detection pixel.

FIGS. 4A to 4D and 5A to 5C are main part sectional views showing the manufacturing steps of the infrared detection pixel. First, as a semiconductor substrate, a so-called SOI substrate is prepared by successively forming the embedded silicon oxide film layer 9 and single crystal silicon layer 8 on the single crystal silicon substrate 6 (FIG. 4A).

Figure 4B:
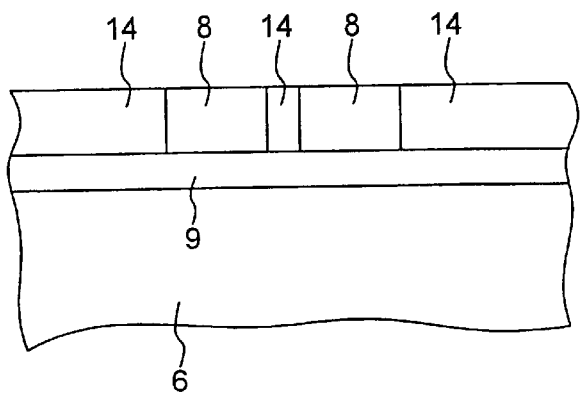

Subsequently, a process similar to shallow-trench-isolation (STI) is performed as isolation. That is, photolithography or another technique is utilized to define an isolation area. After etching and removing the single crystal silicon layer 8 of the isolation area by techniques such as reactive-ion-etching (RIE), an isolation silicon oxide film 14 is embedded by techniques such as chemical-vapor-deposition (CVD) and flatted by techniques such as chemical-mechanical-polishing (CMP) (FIG. 4B). In this case, the area of the support portion 11 is also defined as the isolation area, and the isolation silicon oxide film 14 is embedded.

Figure 4C:
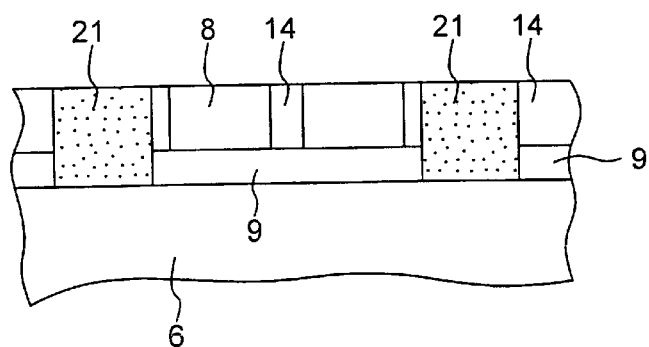

Subsequently, after etching and removing the isolation silicon oxide film 14 and embedded silicon oxide film layer 9 of a support structure isolation area for forming the support portion 11 in the isolation area by techniques such as reactive-ion etching (RIE), a sacrifice silicon film 21 is embedded by techniques such as chemical-vapor-deposition (CVD) and flatted by techniques such as chemical-mechanical-polishing (CMP) (FIG. 4C).

The sacrifice silicon film 21 is a so-called sacrifice layer to be etched by etching the support substrate 6 in a step performed later, and the film may have a single crystal structure, a poly-crystal structure, or a amorphous structure.

In the flatting step by CMP after embedding the sacrifice silicon film 21 in the support structure isolation area, the single crystal silicon layer 8 is exposed. Therefore, in order to protect the surface of the single crystal silicon layer 8 in a so-called active area, prior to the silicon oxide film etching step of the isolation area for the support structure, a step of protecting the surface of single crystal silicon layer 8 by a silicon oxide film or the like is preferably performed.

Subsequently, after forming an n-type impurity area 15 for the pn junction of the sensor portion 10 by the photolithography technique and ion injection or another doping technique similarly as a source/drain area of a peripheral circuit including the address circuit, output portion, and constant-current source, a contact hole 16 and metal wiring 17 are formed for forming a wiring of the peripheral circuit and pn junction. A so-called metallization step is performed (FIG. 4D).

The interlayer insulating film 20 is, for example, formed of a silicon oxide film. The passivation film 18 is, for example, formed of a silicon nitride film. The interlayer insulating film 20 and the passivation film 18 correspond to an absorber.

Figure 4D:
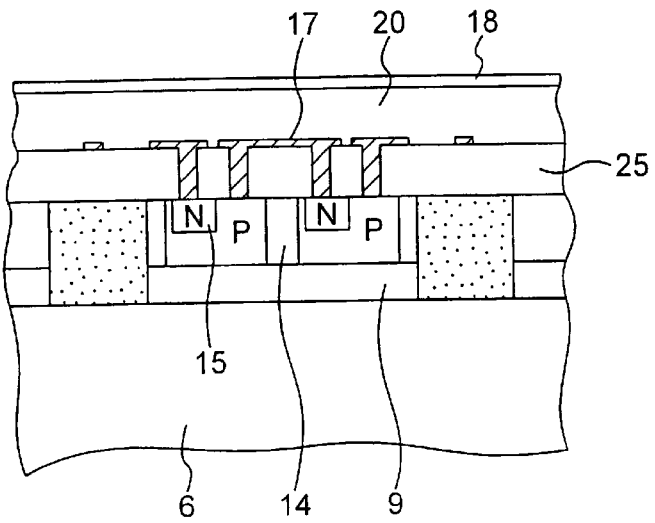

Subsequently, the infrared absorption layer is formed in the sensor portion 10, but in the present embodiment, an interlayer insulating film 20 and passivation film 18 formed in the metallization step can be used (FIG. 4D).

Figure 5A:
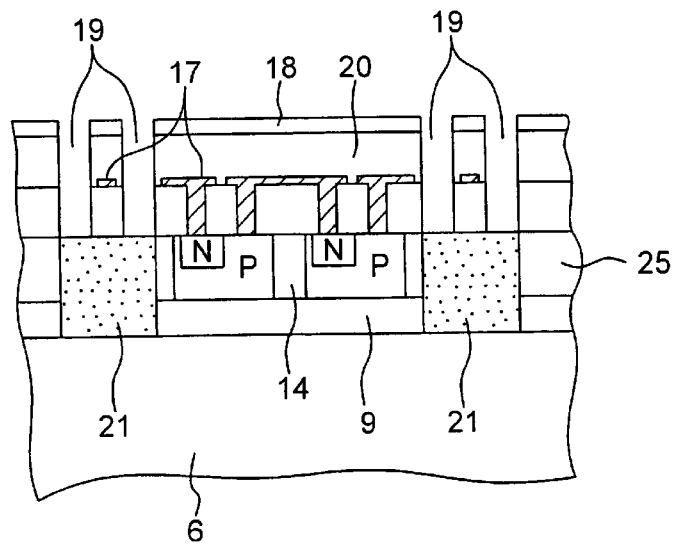
FIGS. 5A to 5C are main part sectional views showing manufacturing steps of the infrared detection pixel, continued from FIGS. 4A to 4D.

Subsequently, in order to form an etching hole 19 for forming the support portion 11 and cavity structure 7, the passivation film 18 and interlayer insulating film are subjected to etching such as reactive-ion-etching (RIE) (FIG. 5A).

Figure 5B:
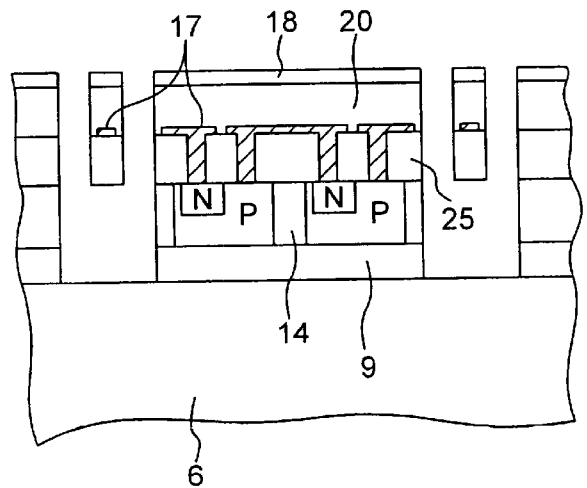

Subsequently, the sacrifice silicon film 21 is etched and removed via the etching hole 19 by chemicals such as tetra methyl ammonium hydroxide (TMAH) (FIG. 5B).

Figure 5C:
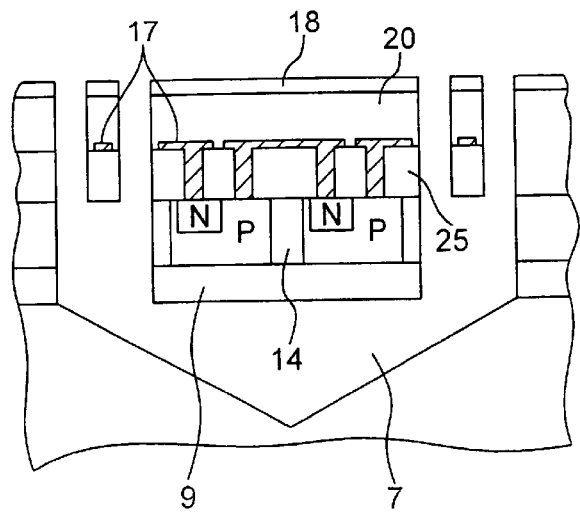

Finally, chemicals such as tetra methyl ammonium hydroxide (TMAH) are used as an anisotropic etchant of single crystal silicon to perform anisotropic etching of single crystal silicon, so that the cavity structure 7 is formed inside the single crystal silicon substrate 6, and a structure of the infrared detection pixel of FIG. 3 can be obtained (FIG. 5C).

In the description of FIGS. 5A to 5C, the step of etching and removing the sacrifice silicon film 21, and the subsequent anisotropic etching step of the single crystal silicon substrate 6 have been independently described. However, the chemicals for use in the etching steps are basically the same. Therefore, in an actual process, after the shape of FIG. 5A is obtained, the chemical such as TMAH is used to perform the etching. In this case, the structure of FIG. 5C as a final shape can be obtained without being conscious of the shape of FIG. 5B.

Of course, it is needless to say that a gate electrode forming step is necessary for forming the transistor for use in the peripheral circuit, but this step is not directly related with the manufacturing process of the infrared detection pixel, and the description of the step has been omitted.

As shown in FIGS. 4A to 4D, in the sensor structure of the present embodiment, immediately after the isolation step, the sacrifice silicon film 21 is embedded/formed in the isolation area for the support portion. Thereafter, this sacrifice silicon film 21 is etched/removed, so that a bottom portion of the support portion is formed to be substantially as high as the single crystal silicon layer 8. Therefore, the support portion 11 is formed to be very thin, a sectional area of the support portion is therefore considerably reduced, and heat conductance between the sensor portion 10 and the support substrate 6 is remarkably reduced. Also when a sectional structure of FIGS. 20A to 20B showing a conventional example is compared with that of the present embodiment, reduction of the sectional area in the present embodiment is evident.

Figure 20A:
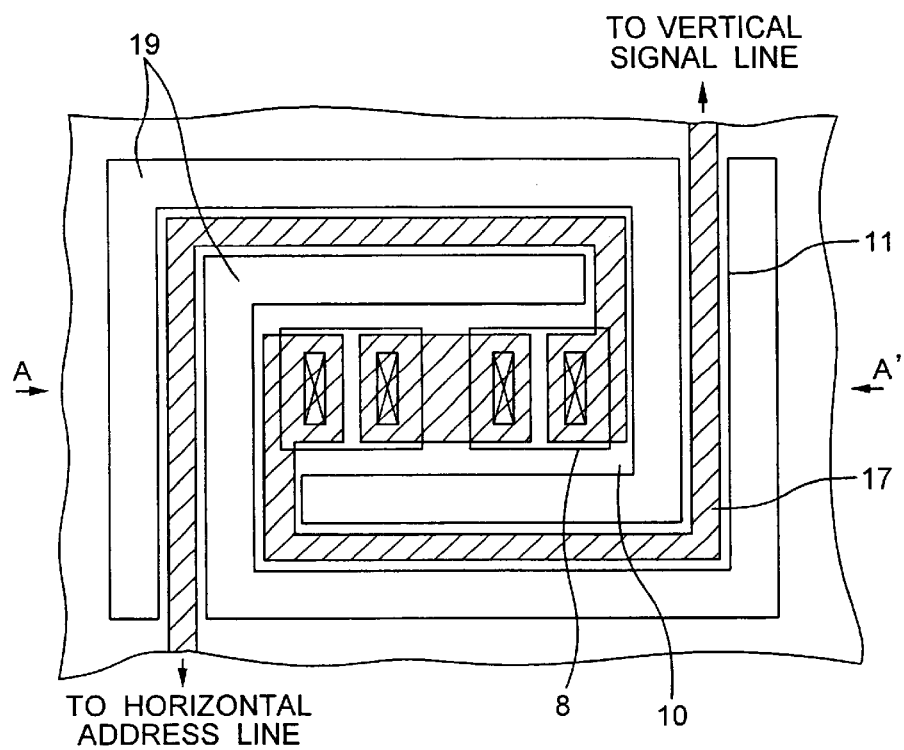
FIG. 20A is a plan view of a conventional infrared detection pixel.
Figure 20B:
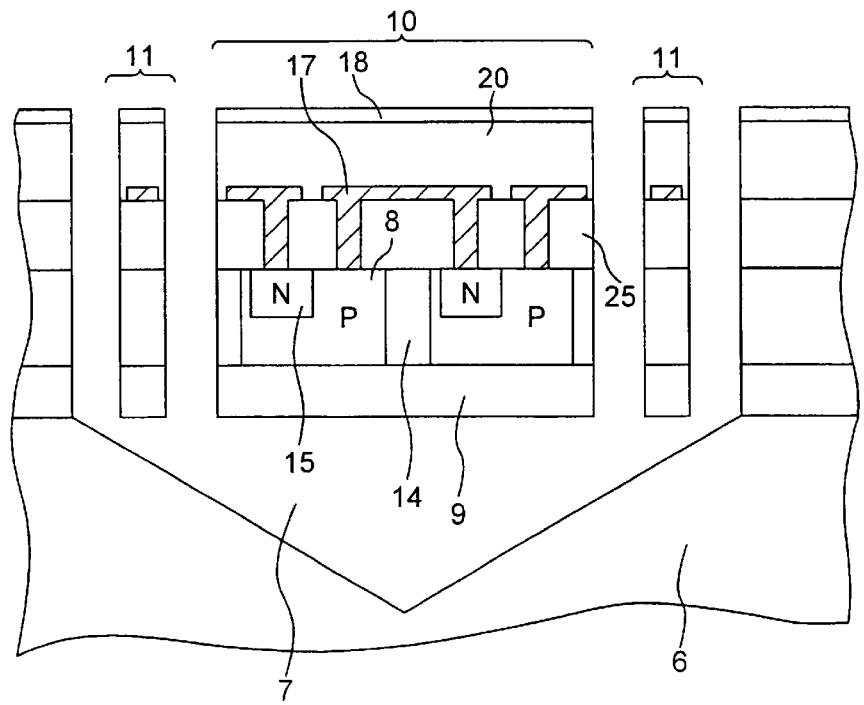
FIG. 20B is a sectional view taken along line A–A' of FIG. 20A.
Figure 21A:
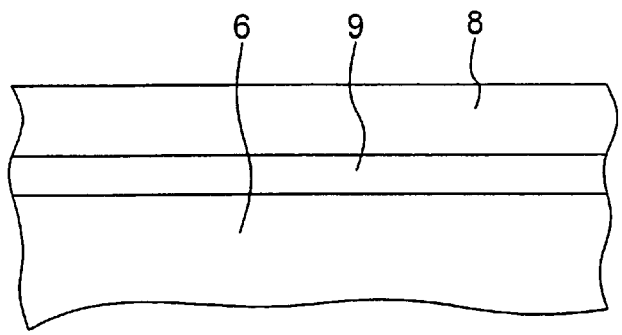
FIGS. 21A to 21C are main part sectional views showing manufacturing steps of the conventional infrared sensor.
Figure 21B:
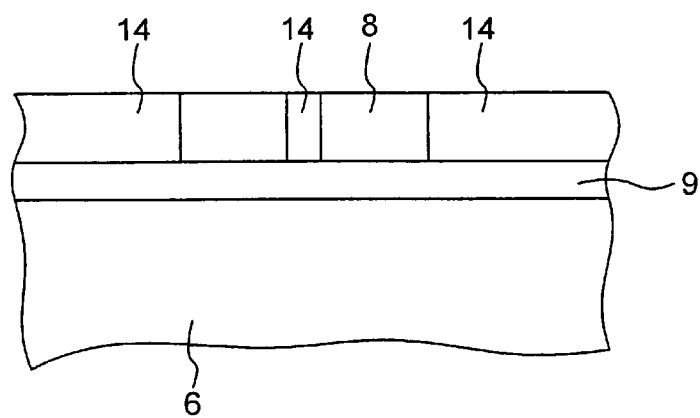
Figure 21C:
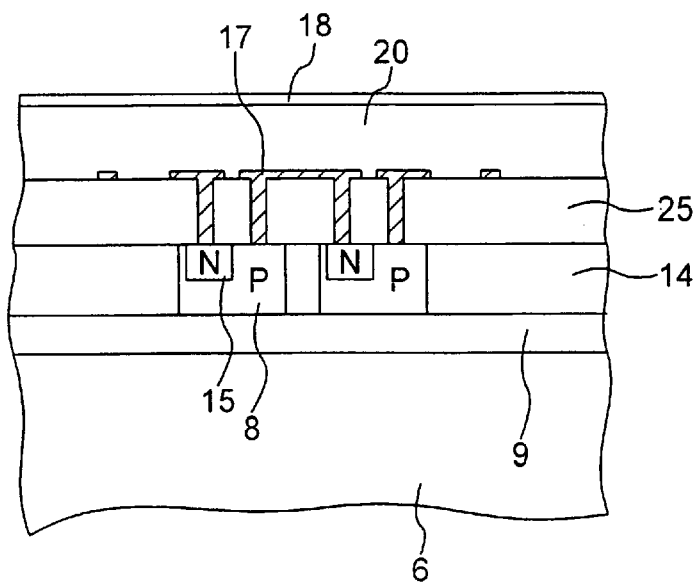

FIG. 20A is a plan view of a conventional infrared detection pixel, and FIG. 20B is a sectional view taken along line A–A' of FIG. 20A. In these drawings, elements similar to those of FIGS. 3A to 3B are denoted with the same reference numerals, and detailed description thereof is omitted.

When comparing the support portion 11 of the present embodiment shown in FIGS. 3A to 3B with the conventional support portion 11 shown in FIGS. 20A to 20B, it is seen that the sectional area of the support portion 11 is remarkably reduced in the present embodiment. As a result, the heat "escape" from the sensor portion 10 can considerably be reduced, a ratio of a sensor portion temperature change to an incident infrared power, that is, so-called heat sensitivity is largely enhanced, and the infrared sensor having a high infrared sensitivity can be obtained.

Here, after forming the shape of FIG. 5A, the area excluding the support portion 11 is protected by a photoresist, and the like. In this state, the passivation film 18 on the surface of the support portion 11 is etched by an appropriate amount. Thereafter, the sacrifice silicon film 21 and support single crystal silicon substrate 6 are etched, and a structure shown in FIGS. 6A and 6B can be obtained.

Figure 6A:
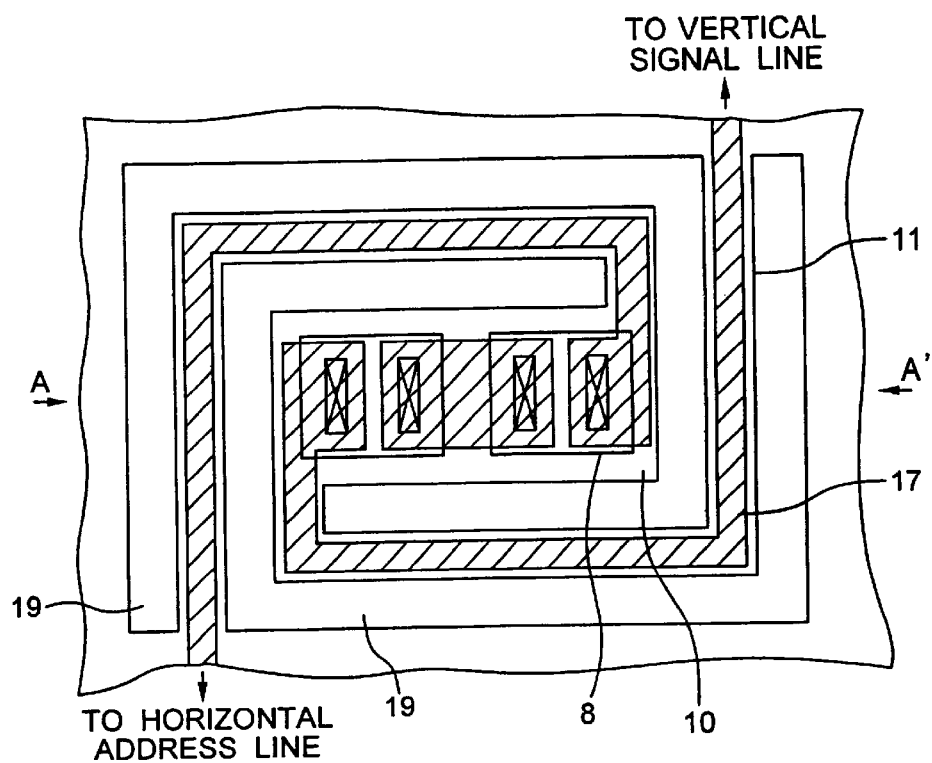
FIG. 6A is a plan view of the infrared detection pixel.
Figure 6B:
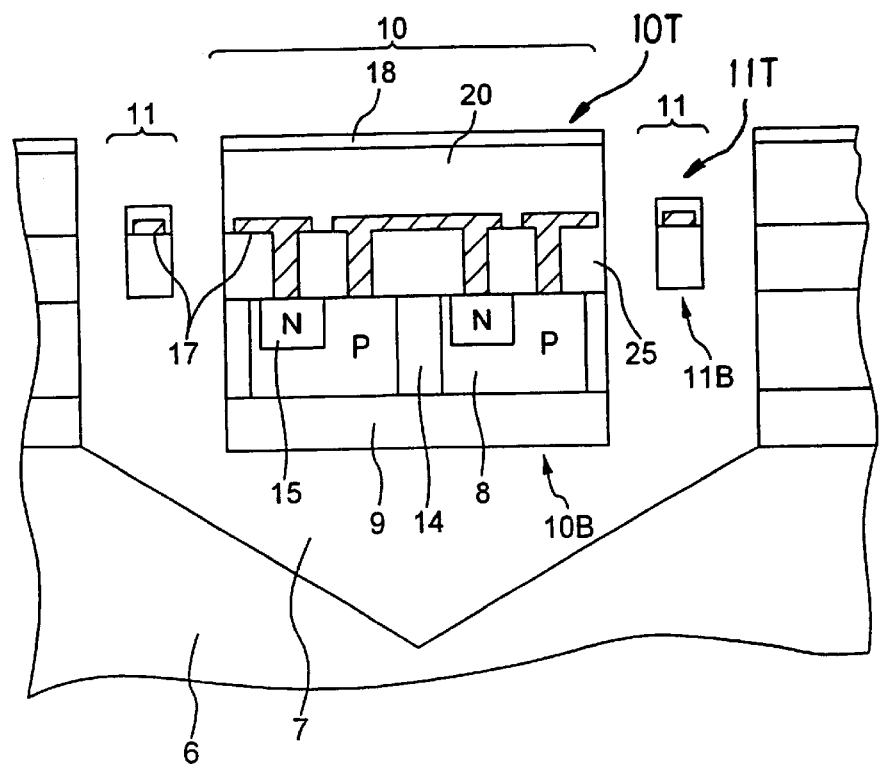
FIG. 6B is a sectional view taken along line A–A' of FIG. 6A.

That is, in the structure shown in FIGS. 6A to 6B, the bottom surface 11B of the support portion 11 is formed at substantially the same height as that of the top surface of the single crystal silicon layer 8, and further a top surface 11T of the support portion 11 is formed in the position lower than that of a top surface 10T of the sensor portion 10. According to the structure of FIGS. 6A to 6B, as compared with the structure of FIGS. 3A to 3B, the sectional area of the support portion 11 is further reduced, the heat "escape" is therefore further inhibited, and the sensitivity of the infrared sensor can further be enhanced.

The top surface 11T of the support portion is etched and formed to be lower than the top surface 10T of the sensor portion, which is actually very advantageous. In order to enhance a sensor sensitivity, the silicon oxide film 20 of the sensor portion 10 needs to be formed to be thick.

Figure 7A:
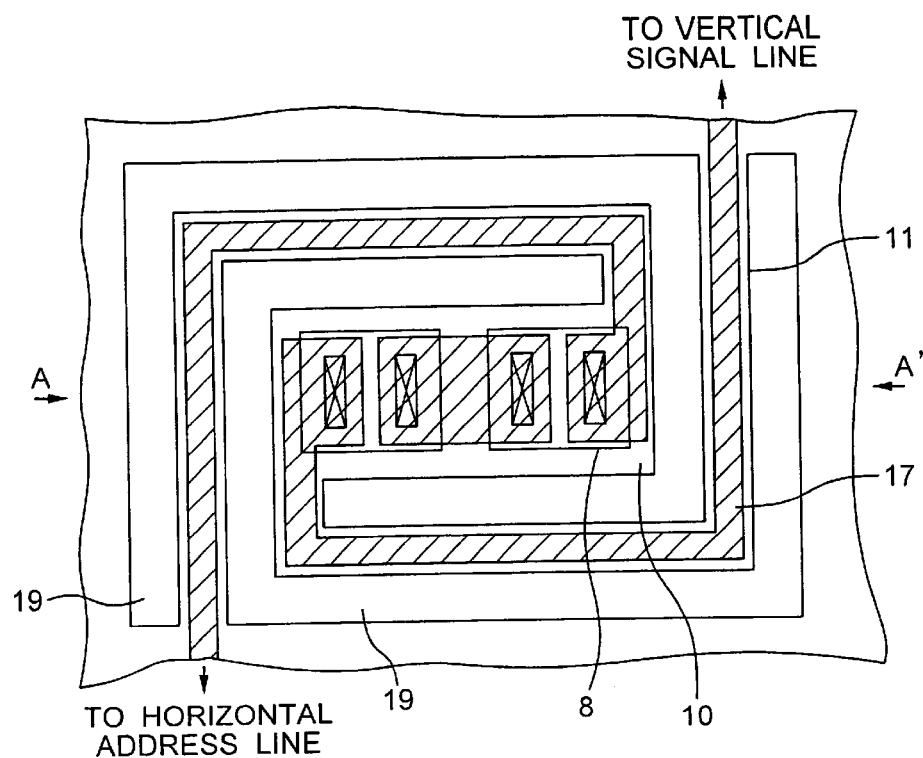
FIGS. 7A and 7B are schematic views showing an example in which a silicon oxide film 20 is formed to be thick.
Figure 7B:
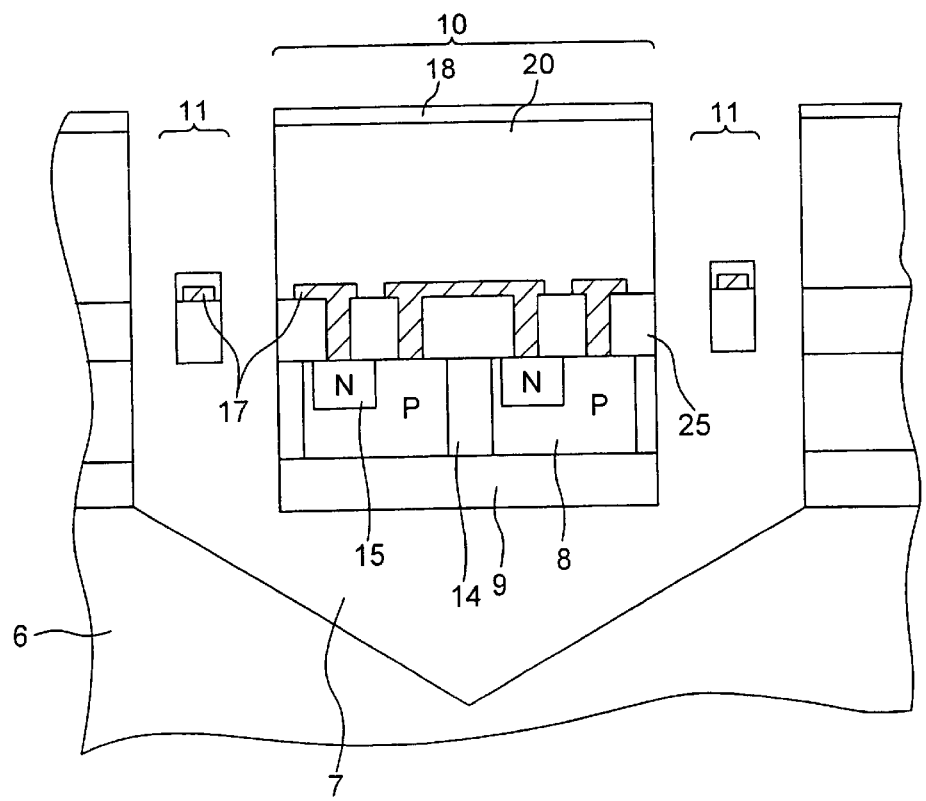

FIGS. 7A and 7B are schematic views showing an example in which the silicon oxide film 20 is formed to be thicker than that of FIGS. 6A and 6B.

That is, in order to raise the sensitivity to the infrared ray, the silicon oxide film 20 of the sensor portion 10 needs to be formed to be thick such that the infrared ray is sufficiently absorbed. In actual, the thickness of the formed silicon oxide film 20 is sometimes 500 nm or more. Furthermore, a silicon nitride film 30 as a light absorption film is sometimes deposited in a thickness of about 300 nm. In this case, when the top surface of the support portion 11 is etched such that the top surface 11T is formed to be lower than the top surface 10T of the sensor portion, the sectional area of the support portion 11 is remarkably reduced, and the sensitivity can further be improved.

Figure 8A:
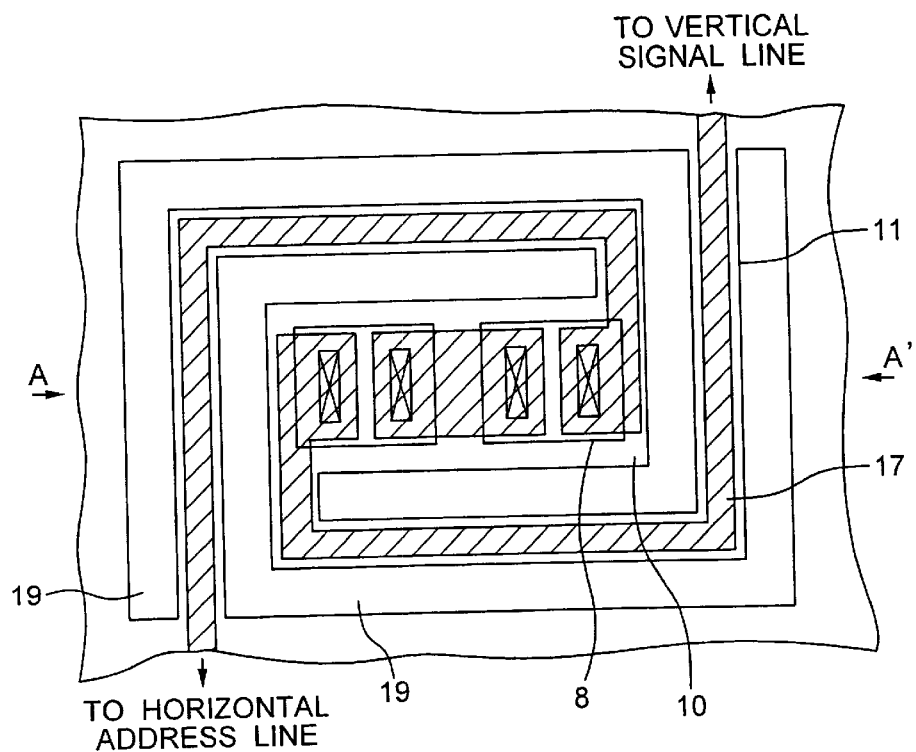
FIGS. 8A and 8B are schematic views showing another concrete example of the infrared sensor according to the first embodiment of the present invention.
Figure 8B:
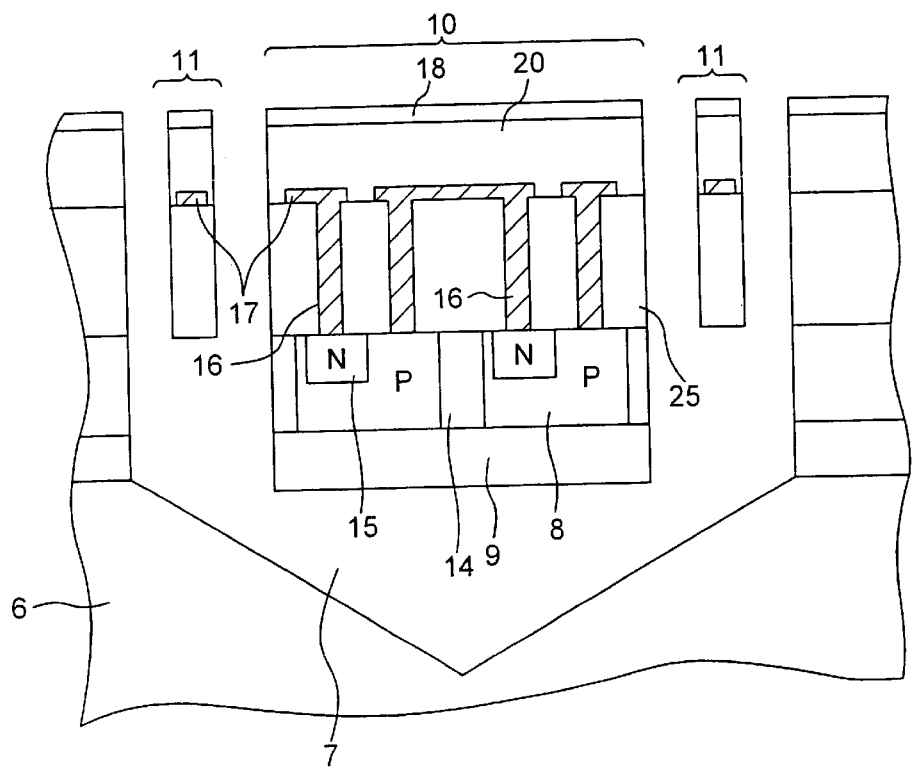

Moreover, FIGS. 8A and 8B are schematic views showing another concrete example of the infrared sensor according to the present embodiment. That is, in this example, the single crystal silicon layer 8 is disposed apart from the wiring 17 as compared with FIGS. 3A to 3B, and the layer is connected to the wiring via a deep contact hole 16. This constitution is sometimes necessary for constituting the peripheral circuit disposed in a periphery of the sensor portion 10. This respect will be described later in detail.

On the other hand, according to the process shown in FIGS. 4 and 5, in addition to the effect that the infrared sensor having the completed structure of FIGS. 3A to 3B is enhanced in sensitivity, there is an effect that the manufacturing process can further be simplified. To describe this respect, first the manufacturing process of the conventional-structure infrared sensor shown in FIGS. 20A to 20B will be described for comparison.

FIGS. 21A to 21C and 22A and 22B are main part sectional views showing the manufacturing steps of the conventional infrared sensor shown in FIGS. 20A and 20B. The manufacturing steps are similar to those of FIGS. 4A to 4D and 5A to 5C, except that the sacrifice silicon film 21 is not embedded in the isolation area for the support structure and that there is no step of removing by etching the sacrifice silicon film 21. Therefore, detailed description is omitted.

A merit in actual preparation will next be described.

Figure 22A:
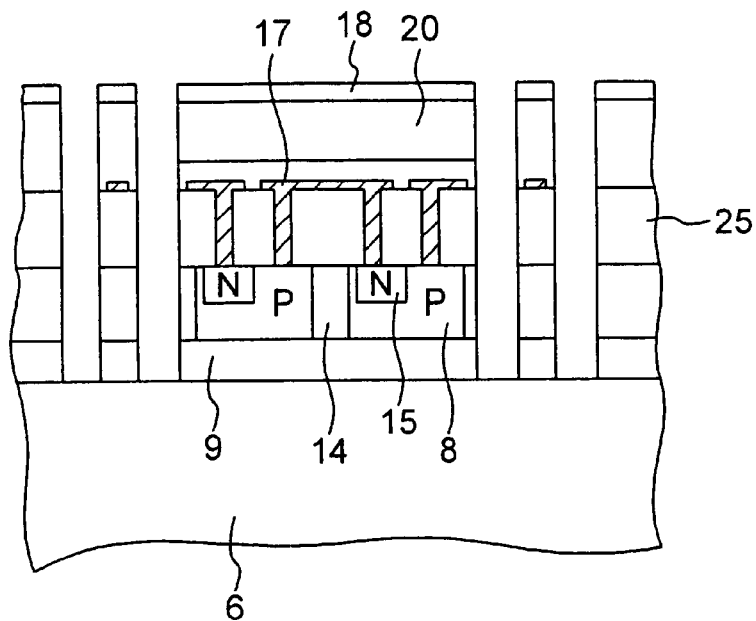
FIGS. 22A and 22B are main part sectional views showing the manufacturing steps of the conventional infrared sensor.
Figure 22B:
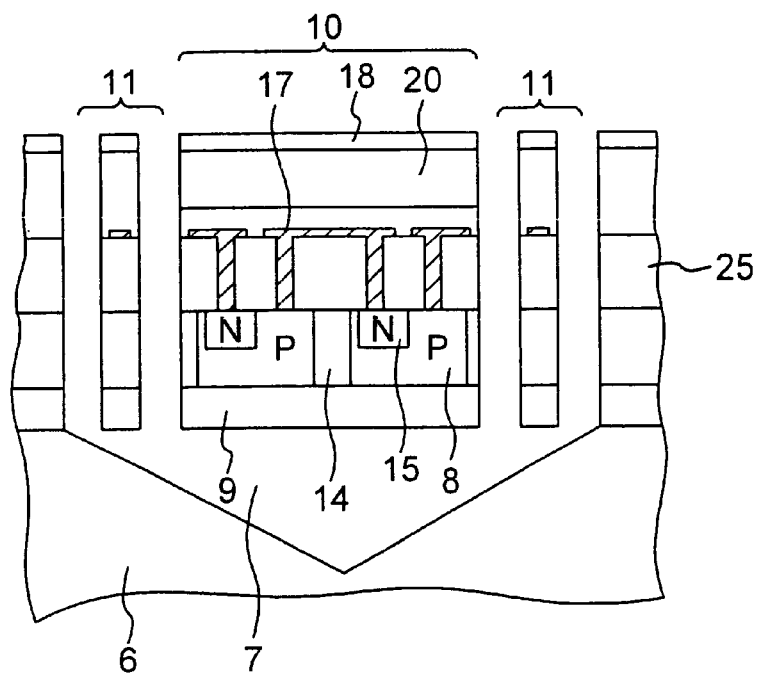

First, a sectional structure shown in FIG. 22A immediately after the silicon oxide film is etched to form both the support portion 11 and the etching hole 19 is compared with the sectional structure of FIG. 5A in the present embodiment.

A silicon oxide film etching pattern in this step is designed in a minimum dimension which can be processed by photolithography, so that the sensor portion 10 is as large in area as possible and the support portion 11 is as thin and long as possible inside a limited pixel area. In order to strictly process the layout designed in the minimum dimension, RIE as anisotropic etching is generally used in etching the silicon oxide film.

It is generally known that a so-called aspect ratio defined as a ratio of an opening width to an etching depth in the etching by RIE is an index of technical difficulty in performing the RIE step. That is, even with the same opening width, in the conventional process (FIGS. 21A to 21C) and FIG. 22A and 22B and conventional structure (FIGS. 20A and 20B) in which a larger etching depth is required, the RIE step is more difficult. Conversely, in the manufacturing process of the present embodiment, easier RIE step is performed.

Furthermore, according to the present embodiment, since the support portion 11 is formed to be thin, in addition to the effects of enhancing the sensitivity and facilitating the manufacturing process, there is a secondary effect of enhancing the sensitivity attributed to the facilitated manufacturing process.

That is, in RIE as the anisotropic etching, etching ion properties are utilized to realize the anisotropic etching vertical to an ion incident direction, that is, to the substrate. However, when the etching depth increases, etching opening width decreases and the aspect ratio is high, incident ion directional properties are deteriorated. In actual, the etched portion is not vertical, and is slightly tapered. This is broadly known as a general fact.

Figure 23A:
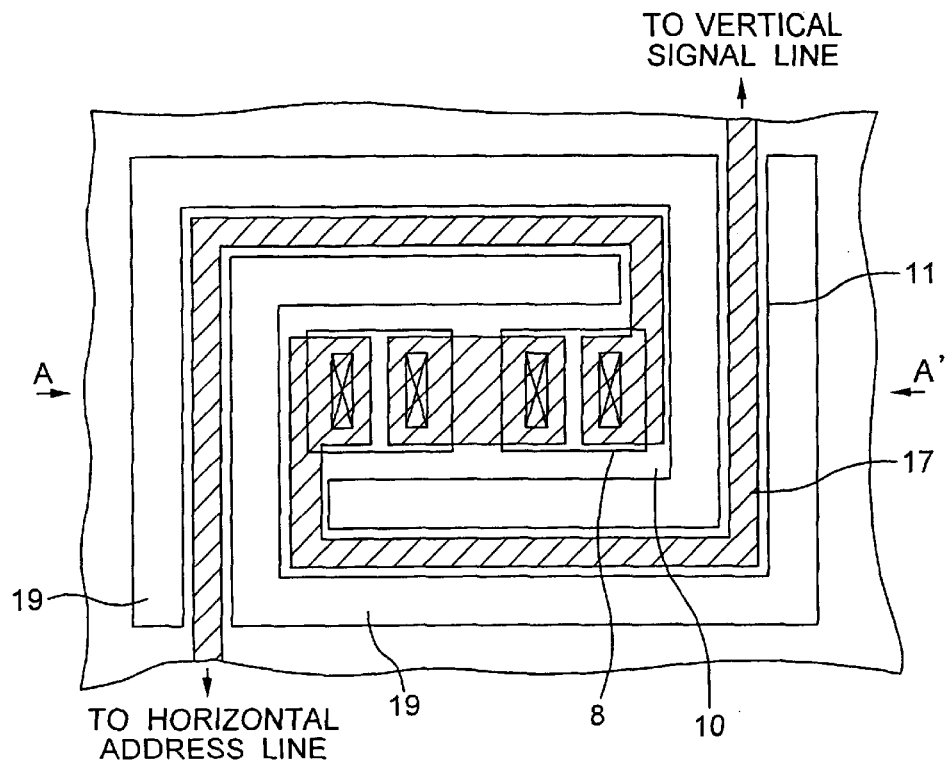
FIG. 23A is a plan view of the conventional infrared detection pixel.

Here, with reference to FIG. 23A, the silicon oxide film RIE with a high aspect ratio is considered. Then, an etching hole portion shown as vertical in FIG. 23A is actually slightly tapered. In consideration of the tapered shape of the etching hole, it is seen that the sectional area of the actually prepared support portion 11 is larger than that shown in FIGS. 22A and 20B for the following two reasons.

For a first reason, in order to form an inverse tapered sectional shape of the support portion 11, the tapered sectional shape of the etching hole is trapezoidal such that upper bottom is longer than lower bottom, and the sectional area of the etching hole is larger than the sectional area designed with the upper bottom and thickness.

For another reason, when the etching hole 19 is tapered, in the etching step of the support single crystal silicon substrate 6, the opening area of the bottom portion of the etching hole 19 to which the etching chemical is supplied is disadvantageously reduced. That is, in consideration of the tapered sectional shape of the etching hole 19, to secure the opening area of the etching hole bottom portion, a layout is necessary such that the upper bottom portion of the etching hole 19 is slightly enlarged. Therefore, the sectional area of the support portion 11 further increases, and the etching of the infrared sensor is further deteriorated.

(Second Embodiment)

A second embodiment of the present invention will next be described. An entire constitution of the infrared sensor of the present embodiment, and the equivalent circuit of the infrared detection pixel are similar to those of the first embodiment shown in FIGS. 1 and 2, and the description thereof is omitted.

Figure 9A:
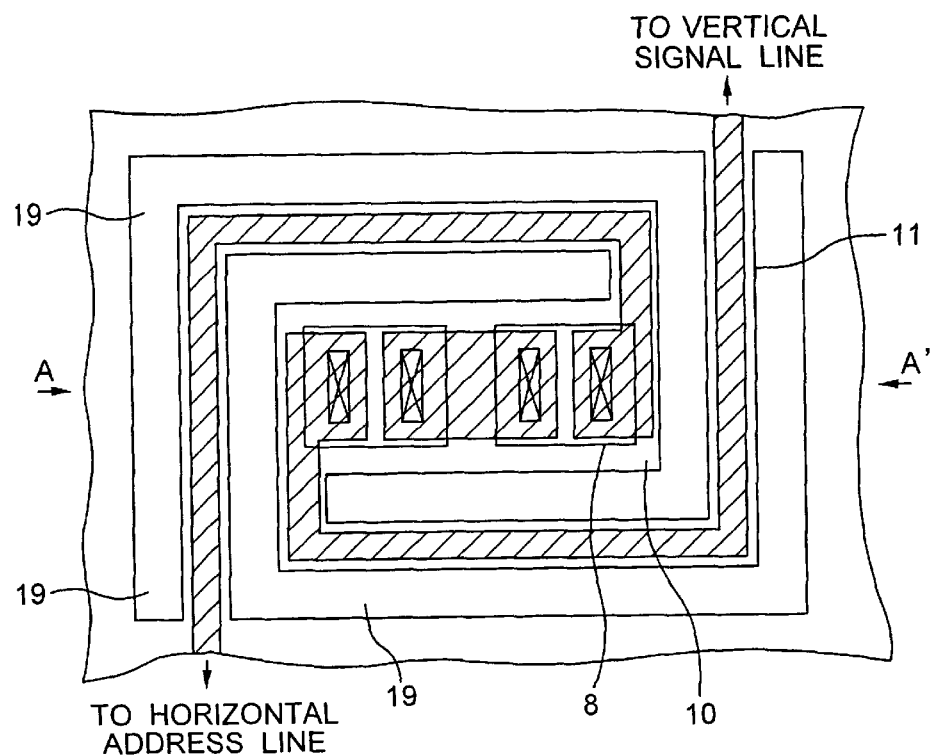
FIGS. 9A and 9B are schematic plan view and sectional view of the infrared detection pixel according to a second embodiment of the present invention.
Figure 9B:
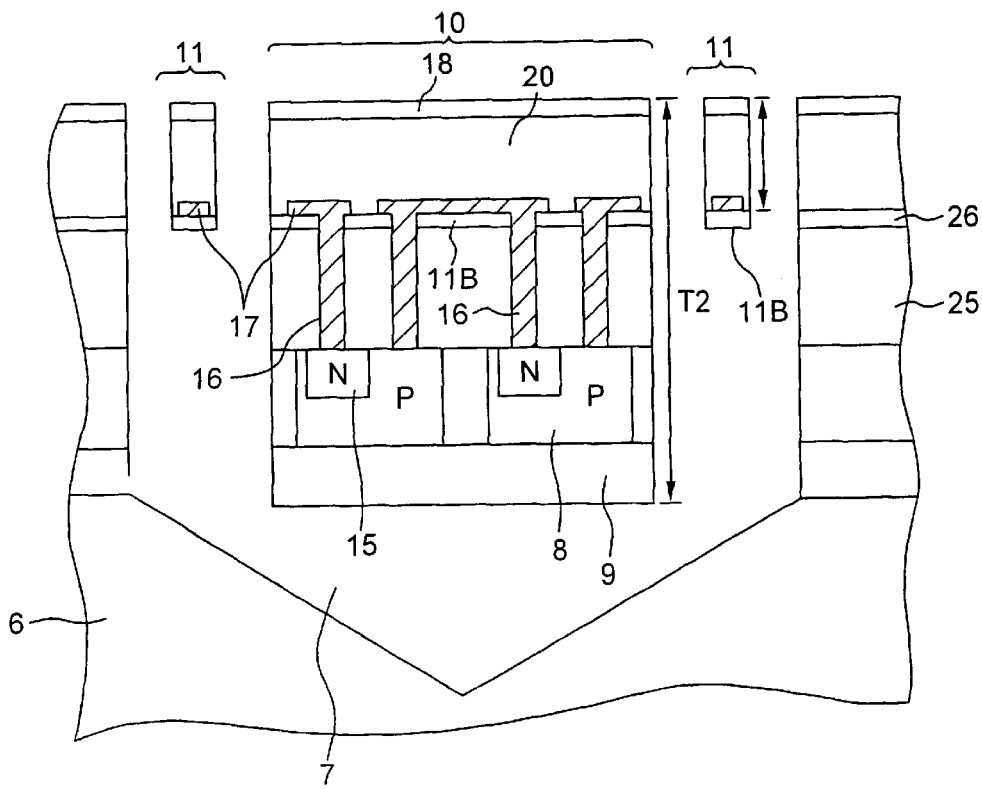

FIGS. 9A and 9B are schematic plan view and sectional view of the infrared detection pixel according to the second embodiment. The structure shown in FIGS. 9A to 9B is similar to that of the first embodiment shown in FIGS. 3A to 3B, except that the bottom surface 11B of the support portion 11 is in a position higher than a position of the single crystal silicon layer 8 as seen from the substrate 6.

Also in the second embodiment, the thickness T1 of the support portion 11 is smaller than the thickness T2 of the sensor portion 10, and the heat "escape" can be inhibited.

Moreover, as compared with FIGS. 3A to 3B, the contact hole 16 in the sensor portion 10 of FIGS. 9A to 9B is deep. This facilitates understanding of a difference of the second embodiment from the first embodiment in the description of the second embodiment.

The difference of the second embodiment from the first embodiment can further easily be understood when comparing the second embodiment shown FIGS. 9A to 9B with the first embodiment shown in FIGS. 8A to 8B. FIGS. 3A to 3B and 9A to 9B showing the first embodiment are different from each other only in that the contact hole 16 in the sensor portion 10 is deep. It can be said that FIGS. 8A to 8B show the structure close to an actual sectional structure than FIGS. 3A to 3B. As not shown in FIGS. 3A to 3B, FIGS. 8A to 8B reflect a situation in which the contact hole 16 in the sensor portion 10 becomes deep because of an existence of the transistor and capacitor constituting the peripheral circuits such as the address circuit and output circuit. This situation will be described with reference to FIG. 10.

Figure 10:
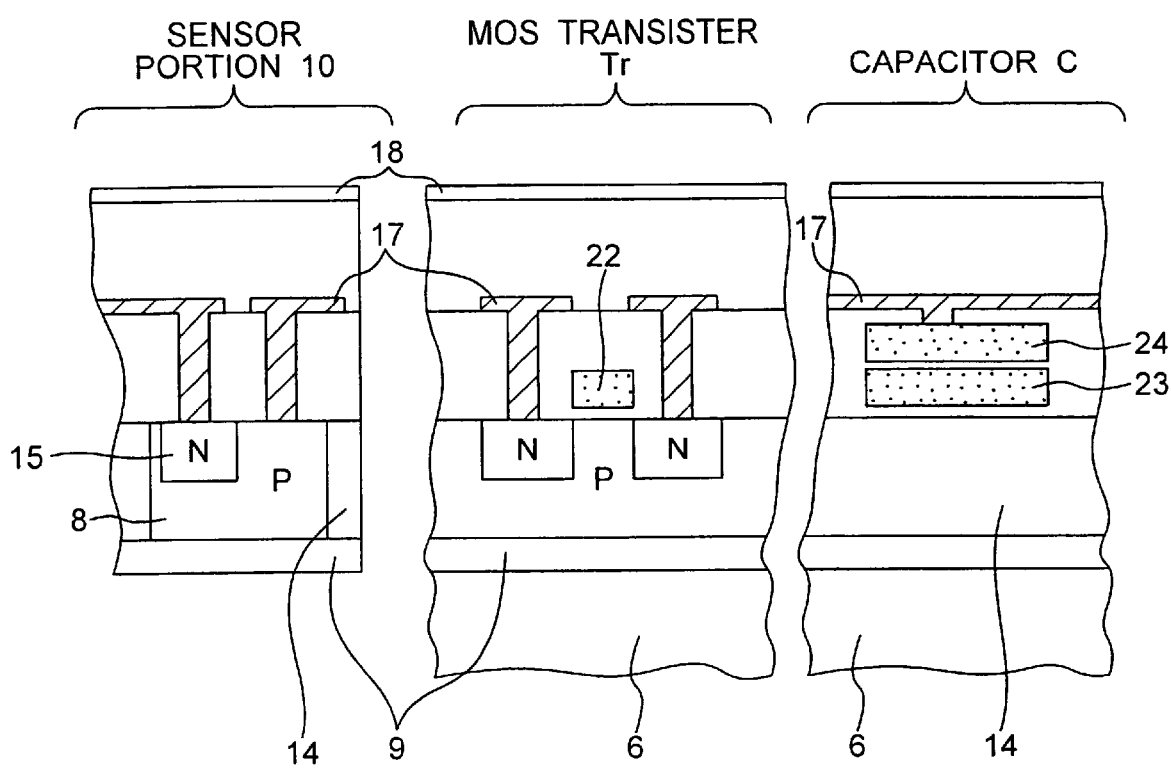
FIG. 10 is a schematic view showing sectional structures of a sensor portion, transistor and capacitor arranged from the left side in a comparable manner.

FIG. 10 is a schematic view showing sectional structures of the sensor portion 10, transistor Tr, and capacitor C arranged from the left side in a comparable manner. Since the structure of the sensor portion 10 is the same as described above, the description thereof is omitted. An n-channel type MOS transistor portion Tr is constituted of an N-type impurity area constituting a source/drain, and a gate electrode 22 formed on a gate oxide film, and the capacitor C is constituted of a capacitor lower electrode 23 on the isolation silicon oxide film 14, and a capacitor upper electrode 24 laminated/formed on the lower electrode via a dielectric film.

Moreover, the wiring 17 formed in these respective areas is a common wiring, and an insulating film surface is flattened by the techniques such as CMP before forming the wiring 17. Therefore, as shown in FIG. 10, it is necessary to form the wiring 17 via the insulating film in a position higher than the transistor gate electrode 22 and capacitor upper electrode 24. Therefore, in the actual sectional structure of the sensor portion, as shown in FIGS. 10 or 8A to 8B, the deep contact hole 16 is disposed. Moreover, considering the actual capacitor structure, the depth of the contact hole is about 1 $\mu$m.

Figure 23B:
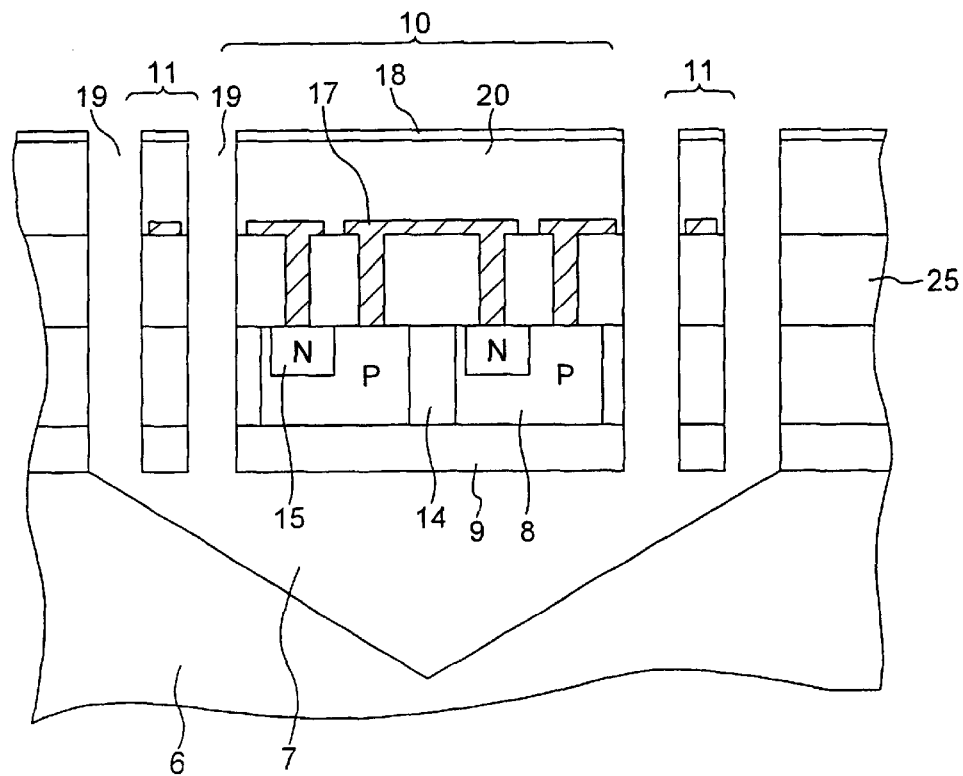
FIG. 23B is a sectional view taken along line A–A' of FIG. 23A.

Similarly, the conventional pixel structure of the infrared sensor is shown in FIG. 23B in which the deep contact hole formed in the sensor portion 10 and attributed to the existence of the peripheral circuit is considered.

Here, the second embodiment will be described turning back to FIGS. 9A to 9B.

The structure of FIGS. 9A to 9B is substantially similar to that of the first embodiment shown in FIGS. 3A to 3B, except that the bottom portion of the support portion 11 is higher in position than the single crystal silicon layer 8, and almost as high as the lower surface of the insulating layer 26. Therefore, as compared with the first embodiment, the sectional area of the support portion 11 can be reduced, and the infrared sensor with a higher sensitivity can be obtained. Here, also as understood from the description with reference to FIG. 10, the thickness of the support portion 11 in the second embodiment is smaller by about 1 $\mu$m than the thickness of the support portion 11 in the first embodiment.

Manufacturing steps of the infrared sensor pixel of the second embodiment will next be described with reference to step sectional views of FIGS. 11A to 13C.

Figure 11A:
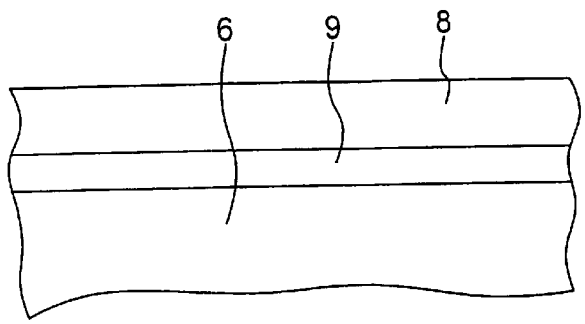
FIGS. 11A to 11D are sectional views showing manufacturing steps of the pixel of the infrared sensor according to the second embodiment of the present invention.

First, as the semiconductor substrate, the so-called SOI substrate is prepared by successively forming the embedded silicon oxide film layer 9 and single crystal silicon layer 8 on the single crystal silicon substrate 6 (FIG. 11A).

Figure 11B:
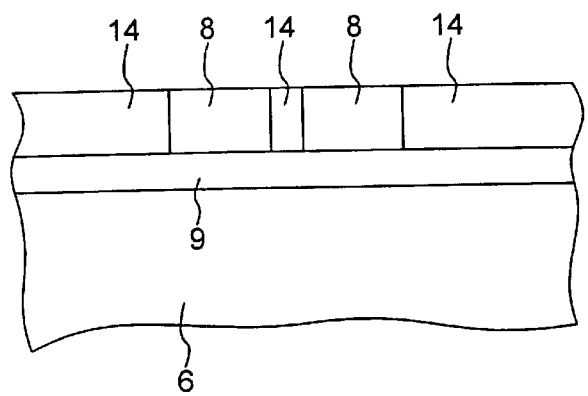

Subsequently, a process similar to shallow trench isolation (STI) is performed as isolation. That is, photolithography or another technique is used to define the isolation area. After removing by etching the single crystal silicon layer 8 of the isolation area by the techniques such as reactive ion etching (RIE), the isolation silicon oxide film 14 is embedded by the techniques such as chemical vapor deposition (CVD) and flatted by the techniques such as chemical mechanical polishing (CMP) (FIG. 11B). In this case, the area of the support portion 11 is also defined as the isolation area, and the isolation silicon oxide film 14 is embedded.

Figure 11C:
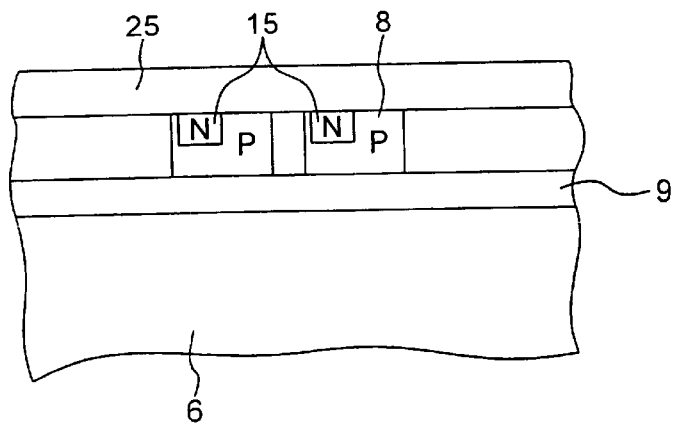

Subsequently, after forming the n-type impurity area 15 for the pn junction of the sensor portion by the photolithography technique and ion injection or another doping technique similarly as the source/drain area of the peripheral circuit including the address circuit, output portion, and constant-current source, an insulating layer 25 is formed (FIG. 11C).

Figure 11D:
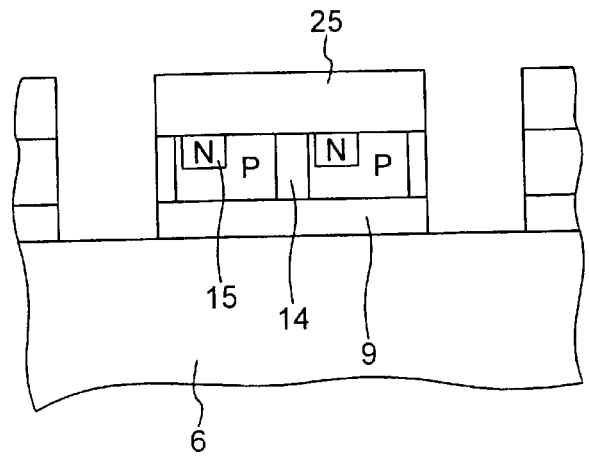

Subsequently, in the isolation area, the insulating layer 25, isolation silicon oxide film 14, and embedded silicon oxide film layer 9 of the support structure isolation area for forming the support portion 11 are etched/removed by the techniques such as the reactive ion etching (RIE) (FIG. 11D).

Figure 12A:
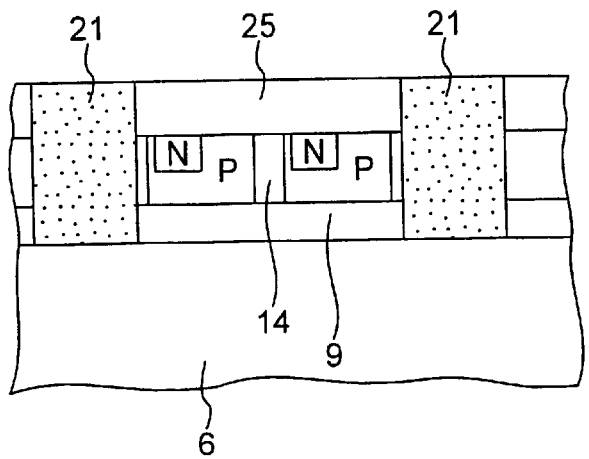
FIGS. 12A to 12C are sectional views showing the manufacturing steps of the pixel of the infrared sensor according to the second embodiment of the present invention, continued from FIG. 11.

Subsequently, the sacrifice silicon film 21 is embedded by the techniques such as the chemical vapor deposition (CVD) and flatted by the techniques such as the chemical mechanical polishing (CMP) (FIG. 12A). The sacrifice silicon film 21 is a so-called sacrifice layer to be etched by etching the support substrate 6 in the step performed later, and the film may have a single crystal structure, a poly-crystal structure, or a amorphous structure.

Figure 12B:
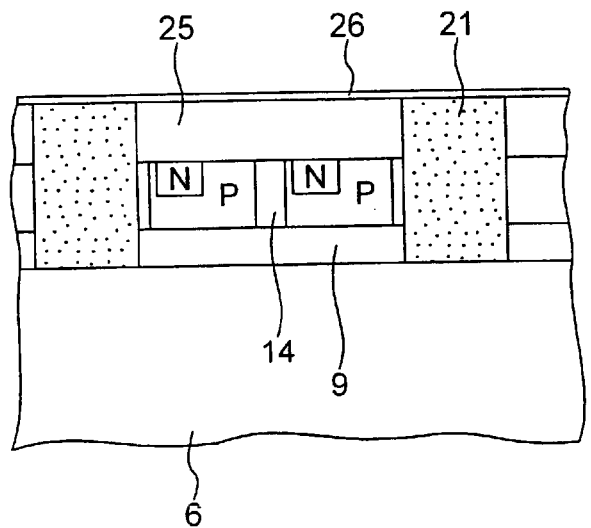

Subsequently, an insulating layer 26 is formed on the top substrate surface, and an insulating layer is formed between the sacrifice silicon film 21 and the wiring 17. In the support portion 11, the insulating layer 26 formed under the wiring 17 finally forms the bottom surface of the support portion 11 (FIG. 12B). The insulating layer 26 is provided to protect the lower surface of the wiring 17 in a lithography step.

Subsequently, the contact hole 16 and metal wiring 17 are formed for forming the wiring of the peripheral circuit and pn junction. The so-called metallization step is performed.

Figure 12C:
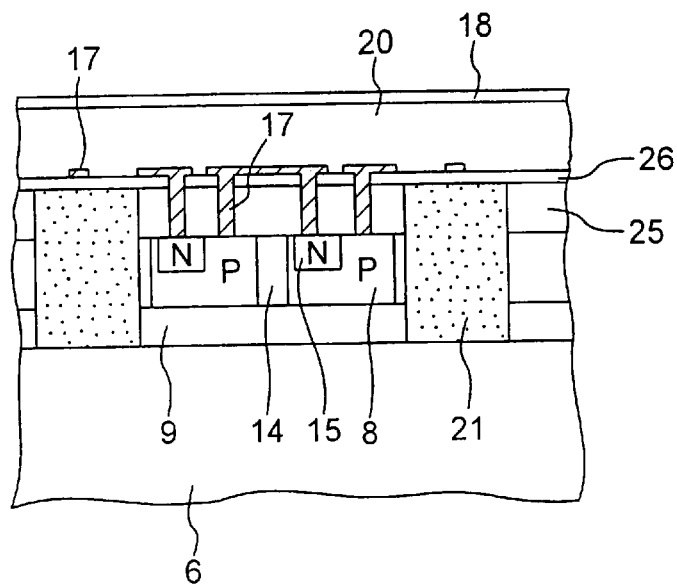

Subsequently, the infrared absorption layer is formed in the sensor portion, but in the present embodiment, the interlayer insulating film and passivation film 18 formed in the metallization step can be used (FIG. 12C).

Figure 13A:
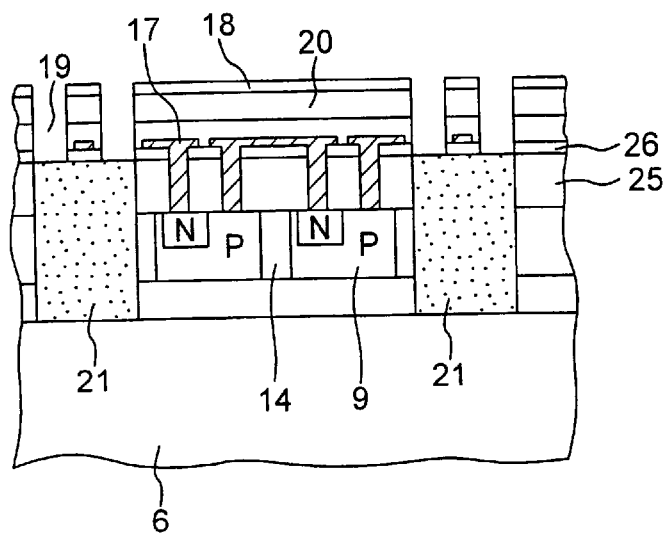
FIGS. 13A to 13C are sectional views showing the manufacturing steps of the pixel of the infrared sensor according to the second embodiment of the present invention, continued from FIGS. 12A to 12C.

Subsequently, to form the etching hole 19 for forming the support portion 11 and cavity structure 7, the passivation film 18 and insulating layer 26 are etched by the reactive ion etching (RIE) (FIG. 13A).

Figure 13B:
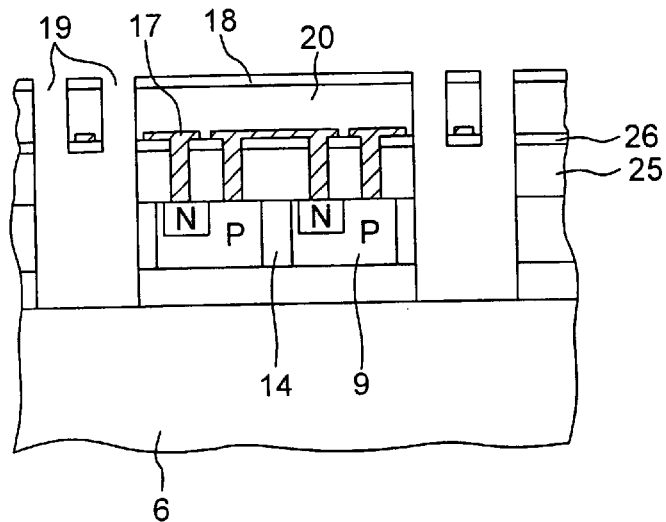

Subsequently, the sacrifice silicon film 21 is etched and removed via the etching hole 19 by the chemicals such as tetra methyl ammonium hydroxide (TMAH) (FIG. 13B).

Figure 13C:
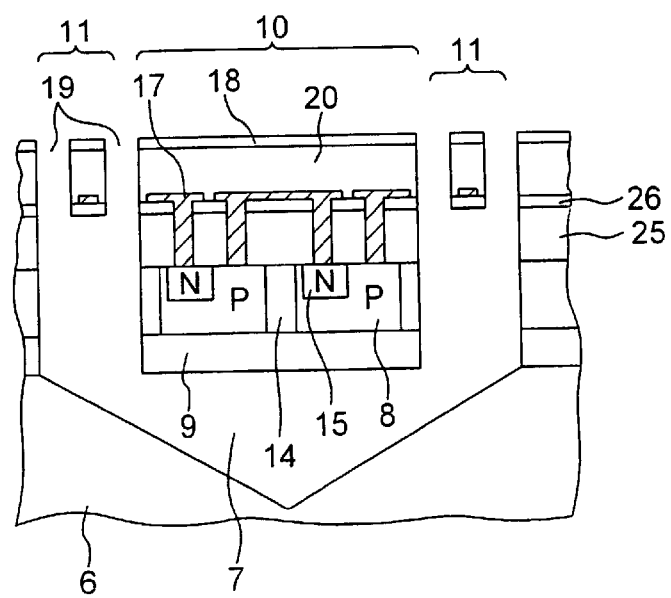

Finally, the chemicals such as tetra methyl ammonium hydroxide (TMAH) are used as the anisotropic etchant of single crystal silicon to perform the anisotropic etching of single crystal silicon, so that the cavity structure 7 is formed inside the single crystal silicon substrate 6 and the structure of the infrared detection pixel of FIGS. 9A to 9B can be obtained (FIG. 13C).

In the description of FIGS. 13B to 13C, the step of removing by etching the sacrifice silicon film 21, and the subsequent anisotropic etching step of the support single crystal silicon substrate 6 have been independently described. However, the chemicals for use in the etching steps are basically the same. Therefore, in the actual process, after the shape of FIG. 13A is obtained, the chemical such as TMAH is used to perform the etching. In this case, the structure of FIG. 13C as the final shape can be obtained without being conscious of the shape of FIG. 13B.

Of course, it is needless to say that the gate electrode forming step is necessary for forming the transistor for use in the peripheral circuit, but this step is not directly related with the manufacturing process of the infrared detection pixel, and the description of the step has been omitted.

As shown in FIGS. 9A to 9B, in the sensor structure of the second embodiment, in the step of flattening the insulating film 25 before the metallization step, the sacrifice silicon film 21 is embedded/formed in the isolation area for the support portion. Thereafter, this sacrifice silicon film is etched/removed, so that the bottom portion 11B of the support portion is formed to be substantially as high as the lower surface of the insulating layer 26. Therefore, the support portion 11 is formed to be further thin, the sectional area of the support portion 11 is therefore considerably reduced, and the heat conductance between the sensor portion 10 and the support substrate 6 is further remarkably reduced. Also in comparison of the sectional view of the second embodiment with that of the conventional example, reduction of the sectional area of the support portion 11 in the present embodiment is evident.

As a result, the ratio of temperature change of the sensor portion to the incident infrared power, that is, the heat sensitivity is largely enhanced, and the infrared sensor with a high infrared sensitivity can thus be obtained.

Figure 14A:
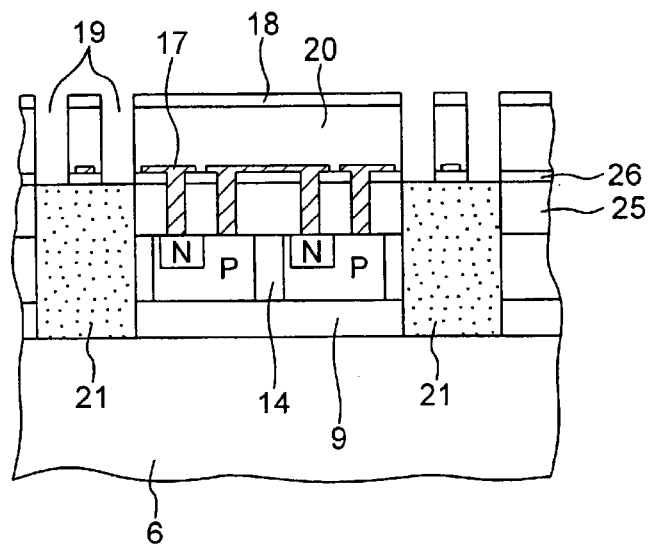
FIGS. 14A to 14C are sectional views showing the manufacturing steps of the pixel of the infrared sensor according to the second embodiment of the present invention, continued from FIGS. 12A to 12C.
Figure 14B:
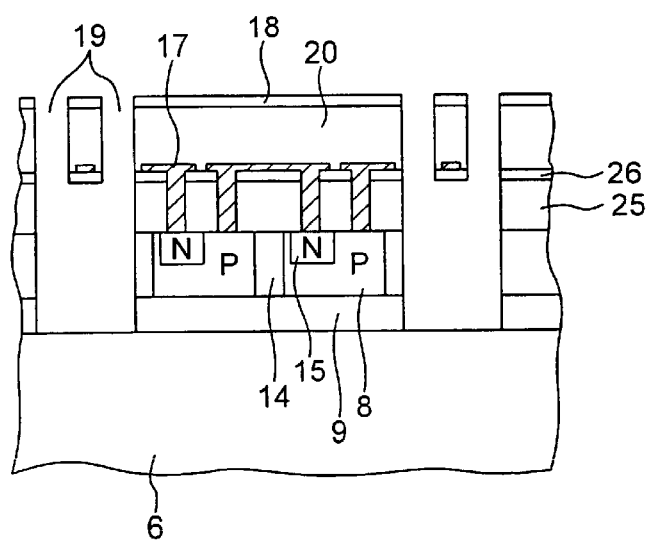
Figure 14C:
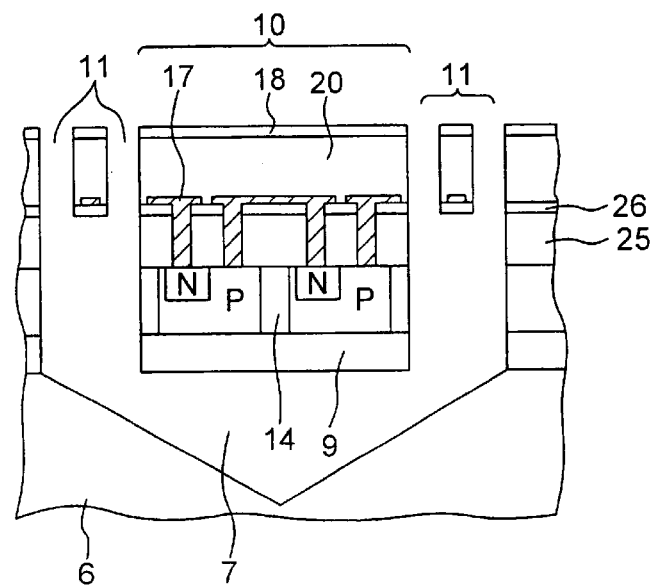

Moreover, after forming the shape of FIG. 13A, the area excluding the support portion 11 is protected by the photoresist or the like. In this state, the passivation film 18 on the surface of the support portion 11 is etched by the appropriate amount, the sacrifice silicon film 21 is then removed (FIG. 14B), and the support single crystal silicon substrate 6 is etched (FIG. 14C), so that the structure shown in FIGS. 15A to 15B can be obtained.

Figure 15A:
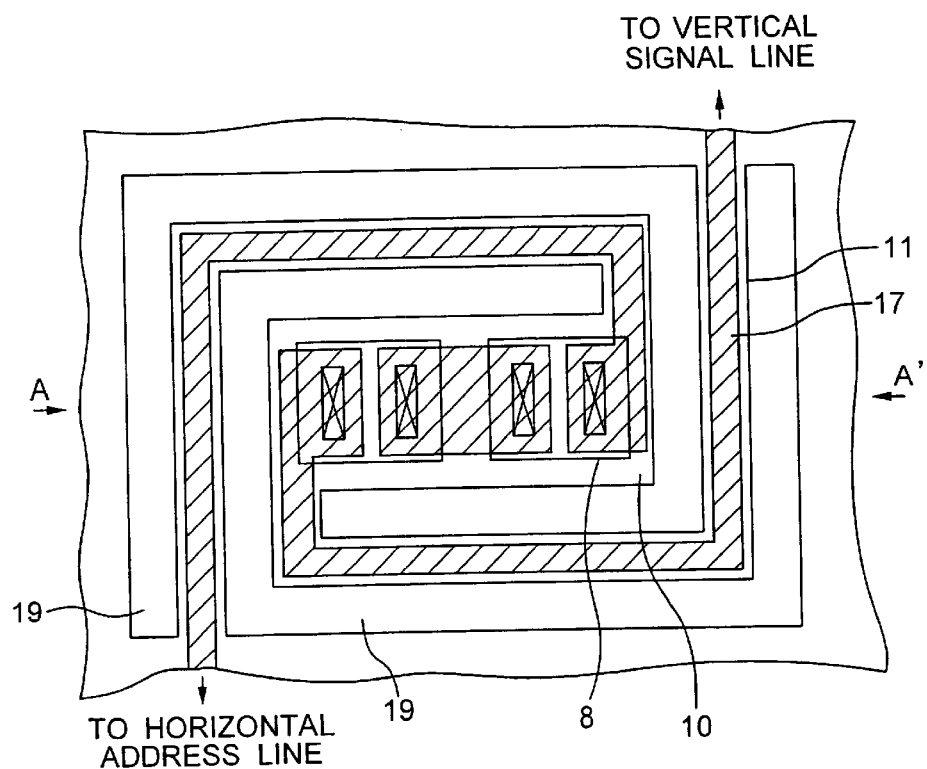
FIGS. 15A and 15B are schematic views showing that a top surface 11T of a support portion 11 is formed to be lower than a surface 10T of a sensor portion 10.
Figure 15B:
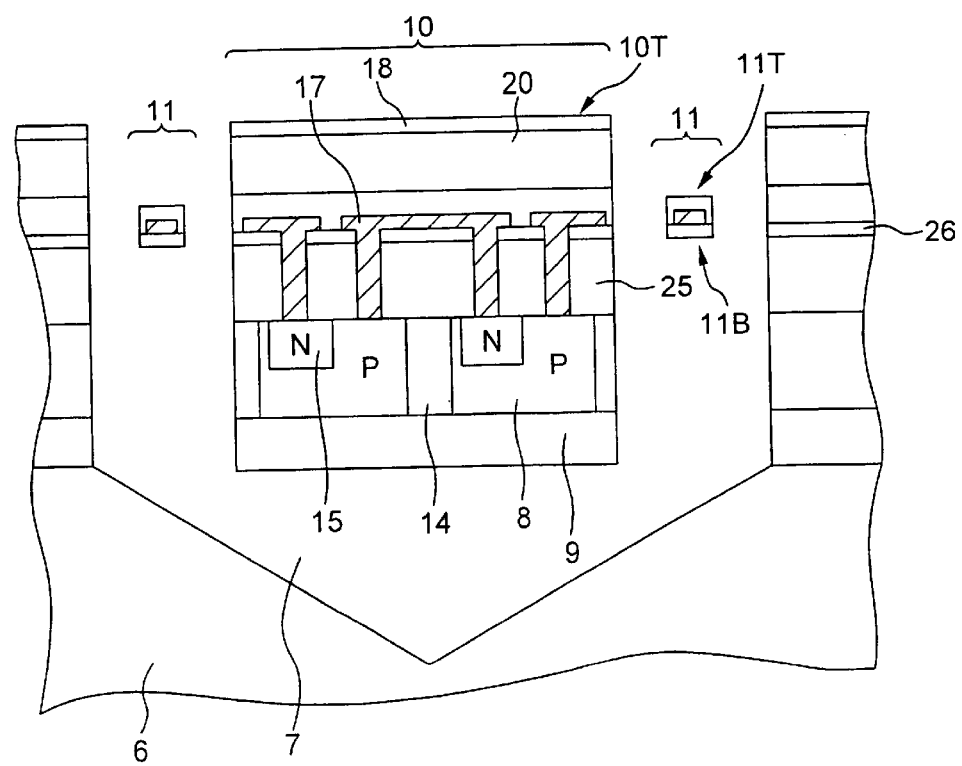

That is, in the structure shown in FIGS. 15A to 15B, the bottom surface 11B of the support portion 11 is formed to be substantially as high as the surface of the wiring 17, and in addition, the top surface 11T of the support portion 11 is formed at a position lower than the surface 10T of the sensor portion 10. According to this structure, as compared with the structure of FIGS. 9A to 9B, the sectional area of the support portion 11 is further reduced, and the sensitivity of the infrared sensor can further preferably be enhanced.

The embodiments of the present invention have been described above with reference to the concrete examples. However, the present invention is not limited to these examples.

For example, the wiring 17 disposed in the infrared sensor of the present invention will further be described. The same material may not be used in the wirings in the sensor portion 10 and support portion 11. For example, metal wiring materials such as aluminum (Al) for use in usual LSI process are used as the material of the wiring 17 in the sensor portion 10, and titanium (Ti) with a low heat conductivity is used in the material of the wiring 17 of the support portion 11, so that the heat "escape" can further preferably be reduced.

In this case, the process of forming the wiring 17 is performed twice in a first wiring forming step of forming an aluminum wiring in the sensor portion 10, and a second wiring forming step of forming a titanium wiring in the support portion 11. In this case, a method of forming the interlayer insulating film between the aluminum wiring and the titanium wiring, and forming a contact hole for connecting both wirings to each other can be used, but the following method can also preferably be used.

In the method, based on a design such that a second wiring pattern is necessarily formed on a first wiring pattern, the second wiring forming step is performed immediately after the first wiring forming step. Of course, only the second wiring pattern is formed in the support portion 11. According to the method, the steps of forming the insulating layer and contact hole become unnecessary. Additionally, it is possible to prevent occurrence of a contact defect because of titanium wiring breakage in the contact hole when the remarkably thin titanium wiring is formed on the upper layer of the contact hole. It is needless to say that the titanium wiring is formed to be remarkably thin for the purpose of reducing heat conductivity of the support portion 11 and enhancing the sensitivity of the infrared sensor.

Referring to these manufacturing steps, and from the sectional areas of the support portions 11 in the present invention shown in FIGS. 3A to 3B and the conventional structure shown in FIGS. 20A to 20B, a thermal conductivity is calculated as follows.

First, it is assumed that the silicon oxide film is used as an insulating material in the support portion 11, and titanium is used in the material of the wiring 17. It is also assumed that the titanium wiring has a width of 0.6 $\mu$m, and a thickness of 0.05 $\mu$m. It is further assumed that a width of the insulating material constituting the support portion 11 is 1.0 $\mu$m so as to protect the titanium wiring.

In the conventional structure of FIGS. 20A to 20B, for the thickness of the insulating layer, the embedded silicon oxide film layer is 0.2 $\mu$m, SOI layer is 0.2 $\mu$m, the silicon oxide film under the wiring is 1 $\mu$m+0.1 $\mu$m, and silicon oxide film on the wiring is 0.5 $\mu$m, then a total film thickness is 2 $\mu$m.

For the present invention of FIGS. 9A to 9B, in the conventional insulating film, the embedded oxide film (0.2 $\mu$m), SOI layer (0.2 $\mu$m) and silicon oxide film under the wiring (1 $\mu$um) are unnecessary. Therefore, the total insulating film thickness is 0.6 $\mu$m.

Here, the heat conductivity per unit length of the Ti wiring of the present invention is the same as that of the conventional example, and is obtained by the following equation.

$$2.2 \times 10^{-5}[\text{W}/\mu\text{m/K}] \times 0.6[\mu\text{m}] \times 0.05[\mu\text{m}] = 6.6 \times 10^{-7}[\mu\text{m·W/K}]$$

Moreover, the heat conductivity per unit length of the silicon oxide film is as follows.

In the conventional example:

$$1.4 \times 10^{-6}[\text{W}/\mu\text{m/K}] \times 1.0[\mu\text{m}] \times 2.0[\mu\text{m}] = 2.8 \times 10^{-6}[\mu\text{m·W/K}]$$

In the present invention:

$$1.4 \times 10^{-6}[\text{W}/\mu\text{m/K}] \times 1.0[\mu\text{m}] \times 0.6[\mu\text{m}] = 8.4 \times 10^{-7}[\mu\text{m·W/K}]$$

When the heat conductivity of Ti and that of the silicon oxide film are totaled, $3.5 \times 10^{-6}[\text{W}/\mu\text{m/K}]$ is obtained in the conventional example, and $1.5 \times 10^{-6}[\text{W}/\mu\text{m/K}]$ is obtained in the present invention.

That is, in the present invention, the heat conductivity is reduced by ($1.5/3.5$) times, that is, to about ½ or less, and as a result, the sensitivity is enhanced twice or more.

The effect of inhibiting the heat "escape" in the support portion 11 has been described in a quantitative manner.

On the other hand, in both the first and second embodiments described above, an array of the infrared detection pixels are two-dimensionally disposed to constitute the infrared sensor. Of course, even when the present invention is applied to a one-dimensional sensor with the infrared detection pixels one-dimensionally disposed therein, or to a single infrared ray having no array arrangement, needless to say, the similar effect can be obtained.

Moreover, in addition to the aforementioned concrete examples, the infrared absorption layers may be laminated.

Figure 16:
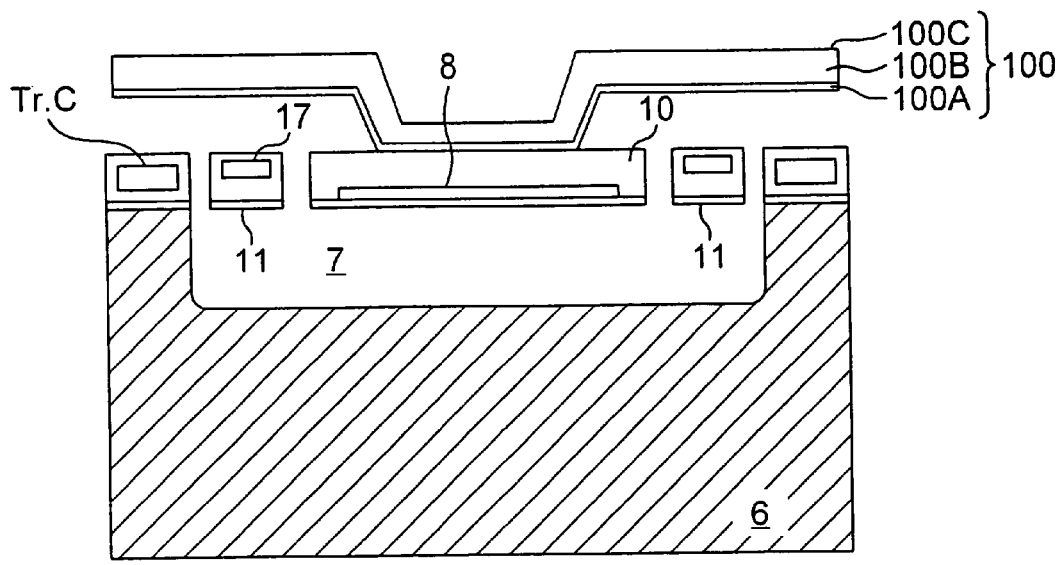
FIG. 16 is a schematic view showing a constitution of the infrared sensor in which infrared absorption layers are laminated/formed.

FIG. 16 is a schematic view showing a constitution of the infrared sensor in which the infrared absorption layers are laminated/formed. That is, in any one of the constitutions described above as the embodiments of the present invention, infrared absorption layers 100 are laminated on the sensor portion 10 (note that FIG. 16 is similar to FIG. 2 of Ishikawa et al discussed as related background art). The infrared absorption layer 100 has a laminated constitution of a reflective layer 100A, insulating layer 100B and absorption layer 100C, and absorbs the infrared ray and supplies heat to the sensor portion 10. Since the infrared absorption layer 100 has a detection area much larger than that of the sensor portion 10, an infrared absorption area is enlarged, and optical sensitivity is effectively enhanced. Therefore, the infrared sensor with higher sensitivity can be obtained.

Moreover, the pn junction for use as the thermoelectric conversion means in the present invention is not limited to the pn junction with a planar structure, and the pn junction with a lateral structure can similarly be employed as the thermoelectric conversion means.

Figure 17:
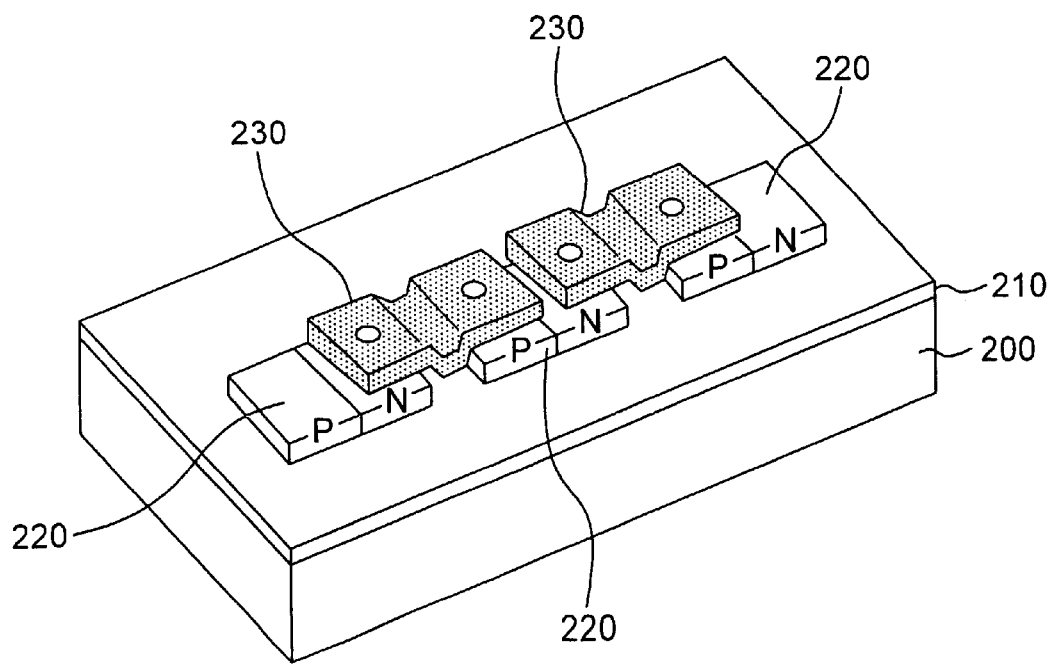
FIG. 17 is a perspective view schematically showing a main part of a lateral pn junctions structure.

FIG. 17 is a perspective view schematically showing a main part of such lateral structure (note that FIG. 17 is similar to FIG. 4 of Ishikawa et al discussed as related background art). That is, in an example of FIG. 17, a plurality of lateral pn junction diodes 220 formed of SOI films are disposed on an embedded oxide film 210 formed on a substrate 200, and are connected in series via a metal strap 230. In the present invention, the pn junction of such lateral structure can similarly be employed as the thermoelectric conversion means.

The present invention can variously be modified in a range without departing from the scope of the present invention.

For example, in the respective embodiments described above, the example of forming the support portion 11 on the sacrifice silicon film 21 has been described, but the sacrifice silicon film 21 may not necessarily be disposed. FIGS. 18A to 19C are views showing manufacturing steps in which the support portion 11 thinner than the conventional support portion is formed without disposing the sacrifice silicon film 21.

Figure 18A:
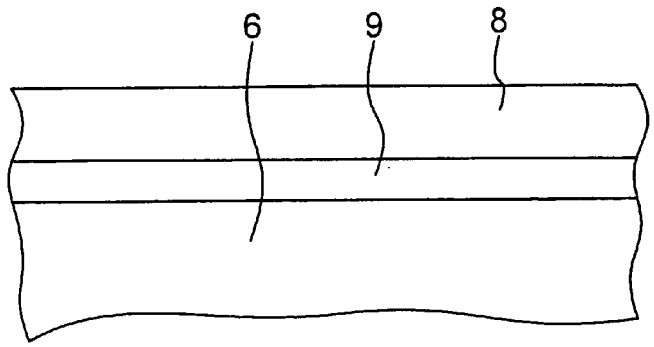
FIGS. 18A to 18C show manufacturing steps for forming a support portion thinner than a conventional support portion without disposing a sacrifice silicon film.
Figure 18B:
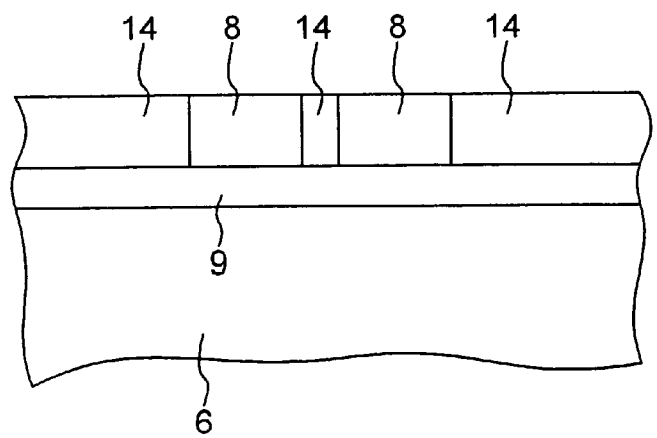
Figure 18C:
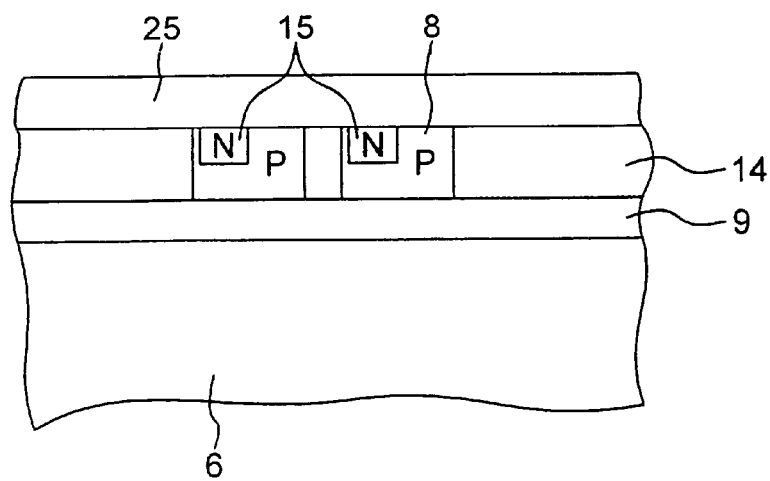

The steps of FIGS. 18A to 18C are similar to those of FIGS. 11A to 11C. The so-called metallization step is performed to form the contact hole 16 and metal wiring 17 for the wiring in the peripheral circuit and pn junction (FIG. 19A).

Figure 19A:
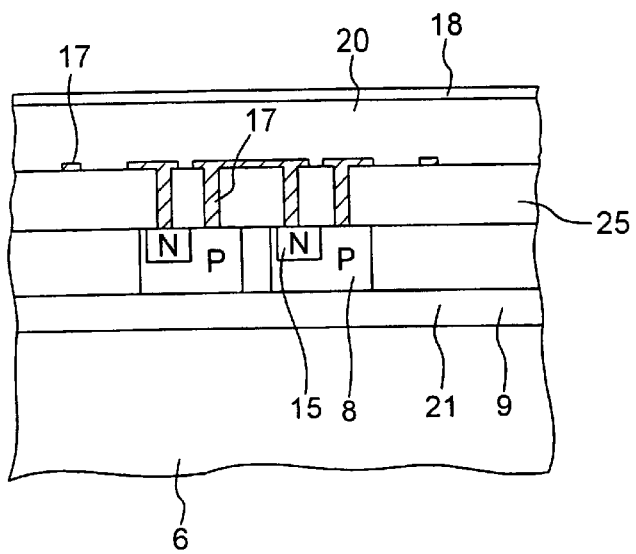
FIGS. 19A to 19C are manufacturing step views continued from FIGS. 18A to 18C.
Figure 19B:
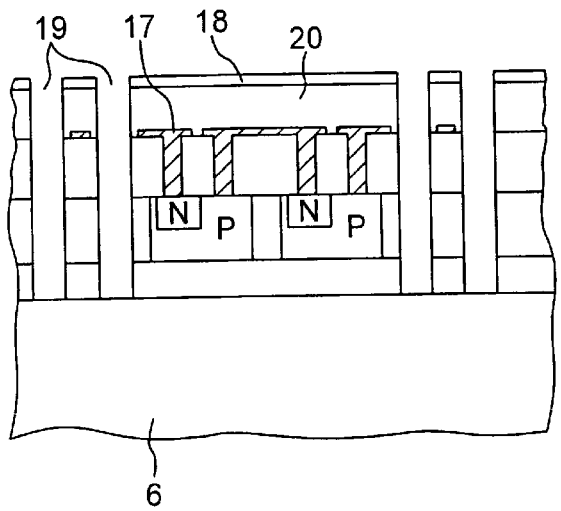
Figure 19C:
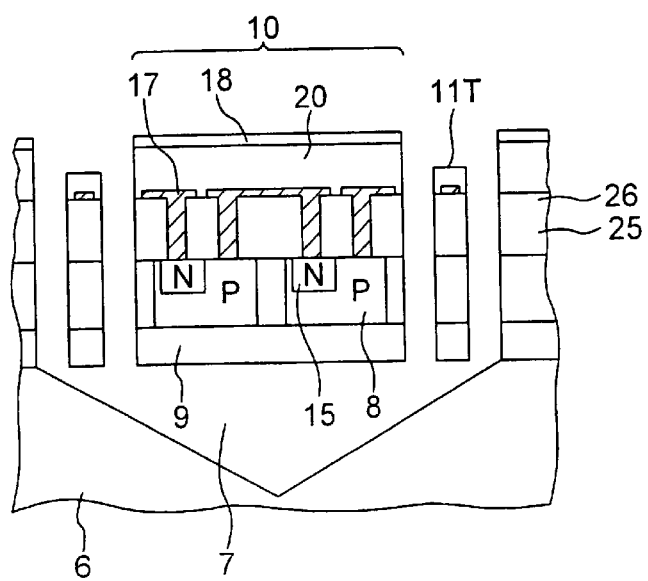

Subsequently, the infrared absorption layer is formed in the sensor portion, but as in the present example, the interlayer insulating film and passivation film 18 formed in the metallization step can also be used (FIG. 19A). Subsequently, to form the etching hole 19 for forming the support portion 11 and cavity structure 7, the passivation film 18 and insulating layer 26 are etched by the reactive ion etching (RIE) (FIG. 20A).

Finally, the area excluding the support portion 11 is protected by the photoresist or the like. In this state, the passivation film 18 on the surface of the support portion 11 is etched by the appropriate amount. Thereafter, the chemicals such as tetra methyl ammonium hydroxide (TMAH) are used as the anisotropic etchant of single crystal silicon to perform the anisotropic etching of single crystal silicon, so that the cavity structure 7 is formed inside the single crystal silicon substrate 6, and the structure of the infrared detection pixel of FIGS. 9A to 9B can be obtained (FIG. 20B).

As described above, according to the present invention, the support portion for supporting the sensor portion in the cavity structure is formed to be remarkably thin as compared with the conventional structure, the sectional area of the support portion is remarkably reduced, the heat conductance can considerably be reduced, and as a result the infrared sensor with a remarkably high sensitivity can be obtained.

Moreover, according to the present invention, the insulating layer of the support portion area is etched, and the sacrifice silicon film is embedded. Therefore, the aspect ratio of the insulating layer RIE for forming the support leg is remarkably reduced, the manufacturing process is facilitated, the sectional area of the support leg is reduced as the secondary effect, and the sensitivity of the infrared sensor can further be enhanced.

Furthermore, as shown in FIG. 3B, when the lower surface 11B of the support portion 11 is positioned higher, it is possible to extend the interval between the taper portion constituted of (111) face of the single crystal silicon and the lower surface 11B of the support portion 11. As a result, it is possible to avoid a sticking trouble in which the support portion 11 is attached to the silicon substrate 6 in the processing step of etching the silicon substrate by using TMAH and a previous or subsequent wet processing step. Therefore, it is possible to obtain a subordinate effect in which manufacturing yield is improved; as a result, cost can be reduced.

Furthermore, as shown in FIG. 20B, when the upper surface 11T of the support portion 11 is positioned lower, the support portion 11 of fine structure is arranged at a location lower than the upper surfaces of the sensor portion or the other element forming portions. Accordingly, in manufacturing steps including assembly, it is possible to decrease a risk in which the other things contact directly to the support portion 11 and the support portion 11. Therefore, it is possible to obtain a subordinate effect in which manufacturing yield is improved; as a result, cost can be reduced.

Thus, according to the present invention, the uncooled infrared sensor with a sensitivity higher than that of the conventional sensor can easily and securely be obtained, and the high-performance sensor can be provided at a low cost in various application fields, which is industrially very advantageous.

What is claimed is:

1. An infrared sensor comprising:
   a semiconductor substrate having a plurality of concave portions;
   a plurality of infrared detectors formed above said semiconductor substrate, each of said infrared detectors having an absorber for absorbing an incident infrared ray and converting the incident infrared ray to heat, and a thermoelectric converter having a pn junction for converting a temperature change caused by the heat generated in said absorber to an electric signal; and
   at least one support member formed to extend in a direction substantially parallel to said substrate, said support member supporting each of said plurality of infrared detectors above a corresponding one of said concave portions so as to be apart from said semiconductor substrate,
   wherein said thermoelectric converter includes a semiconductor layer formed under said absorber, said pn junction being formed in said semiconductor layer,
   one end of said support member is connected to a corresponding one of said infrared detectors and the other end thereof is connected to said semiconductor substrate, and
   a thickness of said support members is smaller than that of a side of said infrared detector facing to said support member.

2. The infrared sensor according to claim 1, wherein a lower surface of each of said support members is located at a height substantially equal to or higher than an upper surface of said semiconductor layer.

3. The infrared sensor according to claim 1, wherein an upper surface of said support member is located lower than an upper surface of said infrared detector.

4. The infrared sensor according to claim 1, further comprising:
   a first insulating layer formed on an upper surface of said thermoelectric converter;
   a second insulating layer formed on an upper surface of said first insulating layer; and
   a wiring layer formed on an upper surface of said second insulating layer and connected to said thermoelectric converter via contact holes formed in said first and second insulating layers,
   wherein said absorber is formed on an upper surface of said wiring layer;
   a second insulating layer extends to a lower surface of said support member to form a third insulating layer; and
   said wiring layer extends over said third insulating layer.

5. The infrared sensor according to claim 1, further comprising:
   a first insulating layer formed on an upper surface of said thermoelectric converter;
   a second insulating layer formed on an upper surface of said first insulating layer; and
   a wiring layer formed on an upper surface of said second insulating layer and connected to said thermoelectric converter via contact holes formed in said first and second insulating layers,
   wherein said absorber is formed on an upper surface of said wiring layer;
   a second insulating layer extends to a lower surface of each of said support members to form a third insulating layer;
   said wiring layer extends over said third insulating layer; and
   an upper surface of said support member is located lower than an upper surface of said absorber.

6. The infrared sensor according to claim 1,
   wherein said infrared detector includes a first wiring extending to each of said support members, and a second wiring connected to said first wiring, said second wiring included in each of said support members, and said first and second wirings output the electric signal from said thermoelectric converter, and
   wherein said second wiring is formed of a material lower in heat conductivity than a material of said first wiring.

7. The infrared sensor according to claim 1,
   wherein said semiconductor layer is included in a single crystal silicon layer of an SOI substrate having a single crystal silicon substrate, an embedded insulating layer, and said single crystal silicon layer stacked in this order.

8. A manufacturing method of an infrared sensor including a plurality of infrared detectors each having an absorber for absorbing an incident infrared ray to convert the incident infrared ray to heat, and a thermoelectric converter, formed in a single crystal silicon layer, having a pn junction for converting a temperature change caused by the heat generated in said absorber to an electric signal; and one or more support members each supporting each of said plurality of infrared detectors apart from a single crystal silicon substrate, each of said support members extending in a direction substantially parallel to said single crystal silicon layer, said manufacturing method comprising:

removing by etching a part of said single crystal silicon layer of an SOI substrate having said single crystal silicon substrate, and said single crystal silicon layer and an embedded insulating layer therebetween, to form a first concave portion exposing said embedded insulating layer;

embedding an isolation insulating layer in said first concave portion;

removing by etching a part of said isolation insulating layer and said embedded insulating layer, to form a second concave portion exposing said single crystal silicon substrate;

embedding a sacrifice silicon layer in said second concave portion;

forming, in said single crystal silicon layer, said thermoelectric converter having the pn junction for converting the temperature change by the heat to the electric signal;

forming a laminate including a wiring layer for outputting the electric signal from said thermoelectric converter and a first insulating film formed thereon, corresponding to a part of said absorber;

forming, on said laminate, a second insulating layer corresponding to another part of said absorber;

partially removing by etching said laminate and said second insulating layer to form each of said support members on said sacrifice silicon layer;

removing by etching said sacrifice silicon layer to expose said single crystal silicon substrate; and etching said exposed single crystal silicon substrate to separate said infrared detector from said single crystal silicon substrate.

9. The manufacturing method of the infrared sensor according to claim 8, wherein when or after forming said support members, the whole of said second insulating layer and a part of said first insulating layer corresponding to an upper portion of each of said support members are etched, thereby setting a thickness of each of said support members to be smaller.

10. The manufacturing method of the infrared sensor according to claim 8, wherein a lower surface of each of said support members is set at a height substantially equal to or higher than an upper surface of said single crystal silicon layer including the pn junction in said thermoelectric converter.

11. The manufacturing method of the infrared sensor according to claim 8, wherein an upper surface of each of said support members is set lower than an upper surface of said absorber.

12. The manufacturing method of the infrared sensor according to claim 8, further comprising:

forming a first wiring extending to each of said support members; and forming a second wiring connected to said first wiring within each of said support members, wherein said first and second wirings output the electric signal from said thermoelectric converter, and wherein said second wiring is formed of a material lower in heat conductivity than a material of said first wiring.

13. A manufacturing method of an infrared sensor including a plurality of infrared detectors each having an absorber for absorbing an incident infrared ray to convert the incident infrared ray to heat, and a thermoelectric converter, formed in a single crystal silicon layer, having a pn junction for converting a temperature change caused by the heat generated in said absorber to an electric signal; and one or more support members each supporting each of said plurality of infrared detectors apart from a single crystal silicon substrate, each of said support members extending in a direction substantially parallel to said single crystal silicon layer, said manufacturing method comprising:

removing by etching a part of said single crystal silicon layer of an SOI substrate having said single crystal silicon substrate, said single crystal silicon layer and an embedded insulating layer therebetween, to form a first concave portion exposing said embedded insulating layer;

embedding an isolation insulating layer in said first concave portion;

forming, in said single crystal silicon layer, said thermoelectric converter having the pn junction for converting the temperature change by the heat to the electric signal;

depositing a first insulating layer on the top surface of said SOI substrate;

removing by etching said first insulating layer, said isolation insulating layer and said embedded insulating layer in a part of an area in which said first concave portion is formed, to form a second concave portion exposing single crystal silicon substrate;

embedding a sacrifice silicon layer in said second concave portion;

depositing a second insulating layer on first insulating layer and the sacrifice silicon layer;

forming a contact portion for outputting the electric signal from said thermoelectric converter in said first and second insulating layers and further forming a wiring;

depositing a third insulating layer corresponding to a part of said absorber to cover the wiring;

forming a fourth insulating layer corresponding to another part of said absorber on an upper surface of said third insulating layer;

partially removing by etching said second insulating layer, said third insulating layer and said fourth insulating layer formed on said sacrifice silicon layer to form each of said support members on said sacrifice silicon layer;

removing by etching said sacrifice silicon layer to expose said single crystal silicon substrate; and etching said exposed single crystal silicon substrate to separate said infrared detector from said single crystal silicon substrate.

14. The manufacturing method of the infrared sensor according to claim 13, wherein when or after forming said support members, the whole of said fourth insulating layer and a part of said third insulating layer corresponding to an upper portion of each of said support members are etched, thereby setting a thickness of each of said support members to be smaller.

15. The manufacturing method of the infrared sensor according to claim 13, wherein said second insulating layer extends to a lower surface of each of said support members to form a fifth insulating layer, and said wiring extends over said fifth insulating layer.

16. The manufacturing method of the infrared sensor according to claim 13, wherein an upper surface of each of said support members is set lower than an upper surface of said absorber.

17. The manufacturing method of the infrared sensor according to claim 13, further comprising:

forming a first wiring extending to each of said support members; and forming a second wiring connected to said first wiring within said support member, wherein said first and second wirings output the electric signal from said thermoelectric converter, and wherein said second wiring is formed of a material lower in heat conductivity than a material of said first wiring.

18. A manufacturing method of an infrared sensor including a plurality of infrared detectors each having an absorber for absorbing an incident infrared ray to convert the incident infrared ray to heat, and a thermoelectric converter, formed in a single crystal silicon layer, having a pn junction for converting a temperature change caused by the heat generated in said absorber to an electric signal; and one or more support members each supporting each of said plurality of infrared detectors apart from a single crystal silicon substrate, each of said support members extending in a direction substantially parallel to said single crystal silicon layer, said manufacturing method comprising:

removing by etching a part of said single crystal silicon layer of an SOI substrate having said single crystal silicon substrate, said single crystal silicon layer and an embedded insulating layer therebetween, to form a first concave portion exposing said embedded insulating layer;

embedding an isolation insulating layer in said first concave portion;

forming the pn junction in said single crystal silicon layer to form said thermoelectric converter;

depositing a first insulating layer on the top surface of said SOI substrate;

forming a contact portion for outputting the electric signal from said thermoelectric converter in said first insulating layer and further forming a wiring;

depositing a second insulating layer corresponding to said absorber to cover the wiring;

forming a third insulating layer corresponding to another part of said absorber on an upper surface of said second insulating layer;

partially removing by etching said single crystal silicon layer, said first insulating layer, said second insulating layer and said third insulating layer to form said support member;

removing by etching the whole of said third insulating layer and a part of said second insulating layer corresponding to an upper portion of each of each of said support members, thereby setting a thickness of each said support members to be smaller; and etching said single crystal silicon substrate to separate said infrared detector from said single crystal silicon substrate.

19. The manufacturing method of the infrared sensor according to claim 18, wherein an upper surface of said support member is set lower than an upper surface of said absorber.

20. The manufacturing method of the infrared sensor according to claim 18, further comprising:

forming a first wiring extending to each of said support members; and forming a second wiring connected to said first wiring within said support member, wherein said first and second wirings output the electric signal from said thermoelectric converter into said infrared detector, and wherein said second wiring is formed of a material lower in heat conductivity than a material of said first wiring.

* * * * *